(12) United States Patent
Shimasaki et al.

(10) Patent No.: US 8,953,312 B2
(45) Date of Patent: Feb. 10, 2015

(54) ELECTRONIC DEVICE AND CASING FOR ELECTRONIC DEVICE

(75) Inventors: Akira Shimasaki, Kawasaki (JP); Hideo Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 166 days.

(21) Appl. No.: 13/445,386

(22) Filed: Apr. 12, 2012

(65) Prior Publication Data

US 2012/0201003 A1     Aug. 9, 2012

Related U.S. Application Data

(63) Continuation of application No. PCT/JP2009/067930, filed on Oct. 16, 2009.

(51) Int. Cl.
  *G06F 1/20* (2006.01)
  *H05K 7/20* (2006.01)

(52) U.S. Cl.
  CPC .................................. *H05K 7/20736* (2013.01)
  USPC ................. 361/679.49; 361/679.48; 361/695; 361/720; 361/721; 361/788; 312/236; 454/184

(58) Field of Classification Search
  USPC ............ 361/679.48, 679.5–679.51, 690, 692, 361/694–695, 788, 679.49; 312/236; 454/184
  See application file for complete search history.

(56) References Cited

U.S. PATENT DOCUMENTS

| | | | | |
|---|---|---|---|---|
| 3,280,377 | A * | 10/1966 | Harris et al. | 361/796 |
| 4,758,925 | A * | 7/1988 | Obata et al. | 361/695 |
| 5,063,477 | A * | 11/1991 | Paggen et al. | 361/695 |
| 5,414,591 | A * | 5/1995 | Kimura et al. | 361/695 |
| 5,497,288 | A * | 3/1996 | Otis et al. | 361/679.46 |
| 6,134,109 | A * | 10/2000 | Muller et al. | 361/700 |
| 6,315,656 | B1 * | 11/2001 | Pawlowski | 454/184 |
| 6,324,056 | B1 * | 11/2001 | Breier et al. | 361/679.46 |
| 6,411,509 | B1 * | 6/2002 | Chuang et al. | 361/695 |
| 6,493,222 | B2 * | 12/2002 | DiFonzo et al. | 361/679.48 |
| 6,501,650 | B2 * | 12/2002 | Edmunds et al. | 361/695 |

(Continued)

FOREIGN PATENT DOCUMENTS

| | | | |
|---|---|---|---|
| CN | 101394731 | 3/2009 | |
| EP | 1367878 A1 * | 12/2003 | H05K 7/20 |

(Continued)

OTHER PUBLICATIONS

International Search Report of PCT/JP2009/067930 mailed Dec. 1, 2009.

(Continued)

*Primary Examiner* — Robert J Hoffberg
(74) *Attorney, Agent, or Firm* — Staas & Halsey LLP

(57) ABSTRACT

In a casing, a printed circuit board is arranged such that a first side of the printed circuit board has a first angle of α° with respect to a first side surface plate. A cooling device is arranged to have a second angle of β with respect to the first side surface plate. Accordingly, an amount of cooling air flowing in and out via an air intake port and an air discharge port may be increased. Furthermore, by reducing the angle of the change in the flow direction of the cooling air flowing over the printed circuit board, the cooling air flowing over the printed circuit board may be made to efficiently flow through an air discharge port 119a. Furthermore, the efficiency with which a heat-generating component on the printed circuit board is cooled may be improved.

17 Claims, 18 Drawing Sheets

(56) References Cited

U.S. PATENT DOCUMENTS

| | | | |
|---|---|---|---|
| 6,717,807 B2 * | 4/2004 | Hikawa | 361/690 |
| 6,813,152 B2 * | 11/2004 | Perazzo | 361/695 |
| 6,951,513 B1 * | 10/2005 | Greenslade et al. | 454/184 |
| 7,061,761 B2 * | 6/2006 | Tucker et al. | 361/695 |
| 7,238,104 B1 * | 7/2007 | Greenslade et al. | 454/184 |
| 7,352,571 B2 * | 4/2008 | Suzuki et al. | 361/679.48 |
| 7,443,680 B1 * | 10/2008 | Peng et al. | 361/704 |
| 7,542,288 B2 * | 6/2009 | Lanus | 361/695 |
| 7,643,286 B2 * | 1/2010 | Hirai et al. | 361/679.5 |
| 7,965,504 B2 * | 6/2011 | Hamlin | 361/695 |
| 8,638,553 B1 * | 1/2014 | Czamara et al. | 361/679.48 |
| 8,842,431 B2 * | 9/2014 | Byers | 361/679.49 |
| 2007/0230118 A1 | 10/2007 | Leija et al. | |
| 2007/0274039 A1 * | 11/2007 | Hamlin | 361/695 |
| 2009/0097204 A1 * | 4/2009 | Byers | 361/695 |
| 2010/0091458 A1 * | 4/2010 | Mosier et al. | 361/695 |
| 2012/0113593 A1 * | 5/2012 | Hsu et al. | 361/696 |
| 2013/0070417 A1 * | 3/2013 | Du | 361/695 |

FOREIGN PATENT DOCUMENTS

| | | | | |
|---|---|---|---|---|
| EP | 2645836 A1 * | 10/2013 | | H05K 7/14 |
| JP | 54-86769 | 7/1979 | | |
| JP | 59-3998 | 1/1984 | | |
| JP | 01036100 A * | 2/1989 | | H05K 7/20 |
| JP | 01077999 A * | 3/1989 | | H05K 7/20 |
| JP | 03014298 A * | 1/1991 | | H05K 7/20 |
| JP | 4-94595 | 3/1992 | | |
| JP | 2001127474 A * | 5/2001 | | H05K 7/20 |
| JP | 2001167806 A * | 6/2001 | | H01M 10/50 |
| JP | 2006-32697 | 2/2006 | | |
| JP | 2010027642 A * | 2/2010 | | H05K 7/20 |

OTHER PUBLICATIONS

Korean Office Action mailed Aug. 22, 2013 in corresponding Korean Application No. 10-2012-7009672.

English Translation of Japanese Patent Publication No. 59-3998, published Jan. 10, 1984.

Office Action, dated Mar. 18, 2014, in corresponding Chinese Application No. 200980161938.9 (12 pp.).

* cited by examiner

ELECTRONIC DEVICE AND CASING FOR ELECTRONIC DEVICE

CROSS-REFERENCE TO RELATED APPLICATION

This application is a continuation of International Application No. PCT/JP2009/067930, filed on Oct. 16, 2009, the entire contents of which are incorporated herein by reference.

FIELD

The embodiments discussed herein are directed to an electronic device and a casing for the electronic device.

BACKGROUND

In a casing or a chassis for an electronic device, multiple printed circuit boards having mounted thereon electronic components that generate heat at the time of operation are often stored in a single-layer or multiple-layer manner. An increase in temperature of the electronic device due to heat generated by the electronic components causes an operational abnormality of the electronic device. Accordingly, in the electronic device, cooling air is usually made to flow through the electronic components that generate heat in order to cool the electronic components.

As illustrated in FIG. 11B, in a casing 100c for an electronic device, the printed circuit board 200 is conventionally arranged such that the printed circuit board 200 is parallel to a first side surface plate 103 of the casing 100c. In this arrangement, cooling air, which flows from an air intake surface 126 of a front surface plate 115 of the casing 100c for the electronic device, changes, first, its flow direction to the vertical direction with respect to the first side surface plate 103 of the casing 100c. The reason for this change is that a electronic component such as a dual inline memory module (DIMM) 201a arranged on the printed circuit board 200 are arranged perpendicularly with respect to the first side surface plate 103 such that the DIMM 201a does not act as a barrier against the flow of the internal air. After the cooling air cools the electronic components on the printed circuit board 200, the cooling air changes its flow direction so as to be parallel to the first side surface plate 103. Then, the cooling air is discharged through an air discharge surface 127 of a back surface plate 105 of the casing 100c.

Furthermore, there is a conventionally used method for arranging, in a casing for an electronic device, two electronic units, in which multiple printed circuit boards having mounted thereon the electronic components are arranged in parallel, are arranged in a V-shaped manner by inclining the electronic units with respect to the normal line of a base plate of the casing for the electronic device. In this method, a channel is formed such that cooling air from the base plate of the casing flows from the lower area to the upper area of the inclination of the printed circuit boards arranged in the electronic unit and is discharged from a top plate of the casing.

Patent Document 1: Japanese Laid-open Patent Publication No. 59-003998

However, with a conventional technology represented by the technology described above, because cooling air does not make a channel through which air flows smoothly over the printed circuit boards, there is a problem in that the cooling efficiency of the electronic components mounted on the printed circuit boards is low. Furthermore, because air flow space is needed in the casing, there is also a problem in that the size of the casing itself becomes large.

Specifically, as illustrated in FIG. 11B, the printed circuit board 200 is arranged in the casing 100c and a channel for air inflow and outflow is formed, as indicated by the arrow in FIG. 11B, the cooling air flowing into the casing 100c significantly changes its flow direction until it flows outside of the casing 100c. This causes resistance against the flow of the cooling air and the amount of the cooling air decreases, thus reducing the cooling efficiency.

SUMMARY

According to an aspect of an embodiment of the invention, an electronic device includes a casing that includes a front surface plate that has an air intake port, a back surface plate that has an air discharge port and that opposes the front surface plate, a first side surface plate, a second side surface plate that opposes the first side surface plate, and a shelf that is horizontally arranged; a printed circuit board, having mounted thereon a heat-generating component, that has a first side and a second side and that is arranged, in a space bounded by the front surface plate, the back surface plate, the first side surface plate, the second side surface plate, and the shelf, such that the first side is arranged to have a first angle of $\alpha$ ($0°<\alpha<90°$) with respect to the first side surface plate; and a cooling device that includes an air inlet surface having an air inlet port and an air discharge surface having an air discharge port, that is arranged, between the printed circuit board and the air discharge port in the space, to have a second angle of $\beta$ ($0°\leq\beta\leq90°$) with respect to the first side surface plate, and that cools the heat-generating component.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of an electronic device disclosed in the present invention will be described in detail below with reference to the accompanying drawings. In an example of the embodiments, a description will be given by using a server device as an example of the electronic device, in which a plurality of system boards having mounted thereon at least a processing unit and a storing unit are arranged in a casing or chassis.

The casing is a server rack or a server chassis. The processing unit is, for example, a central processing unit (CPU), a micro processing unit (MPU), a micro control unit (MCU), or a digital signal processor (DSP). The storing unit is typically a semiconductor memory, such as a random access memory (RAM) or a read only memory (ROM).

The technology disclosed in the present invention may be widely used for an electronic device having a casing therefor that stores therein at least one printed circuit board having mounted thereon at least one of an integrated circuit, such as a processing unit or a storing unit that is a heat-generating electronic component, a power supply apparatus, or a heat sink having a fin that dissipates heat generated by the electronic component.

Furthermore, the technology disclosed in the present invention may also be used for a communication device, such as a switchboard, a router, a LAN switch, or the like. Furthermore, the technology disclosed in the present invention may also be used for a personal computer having mounted thereon a motherboard. Accordingly, the present invention is not limited to the embodiments described below.

[a] First Embodiment

Figure 1A:
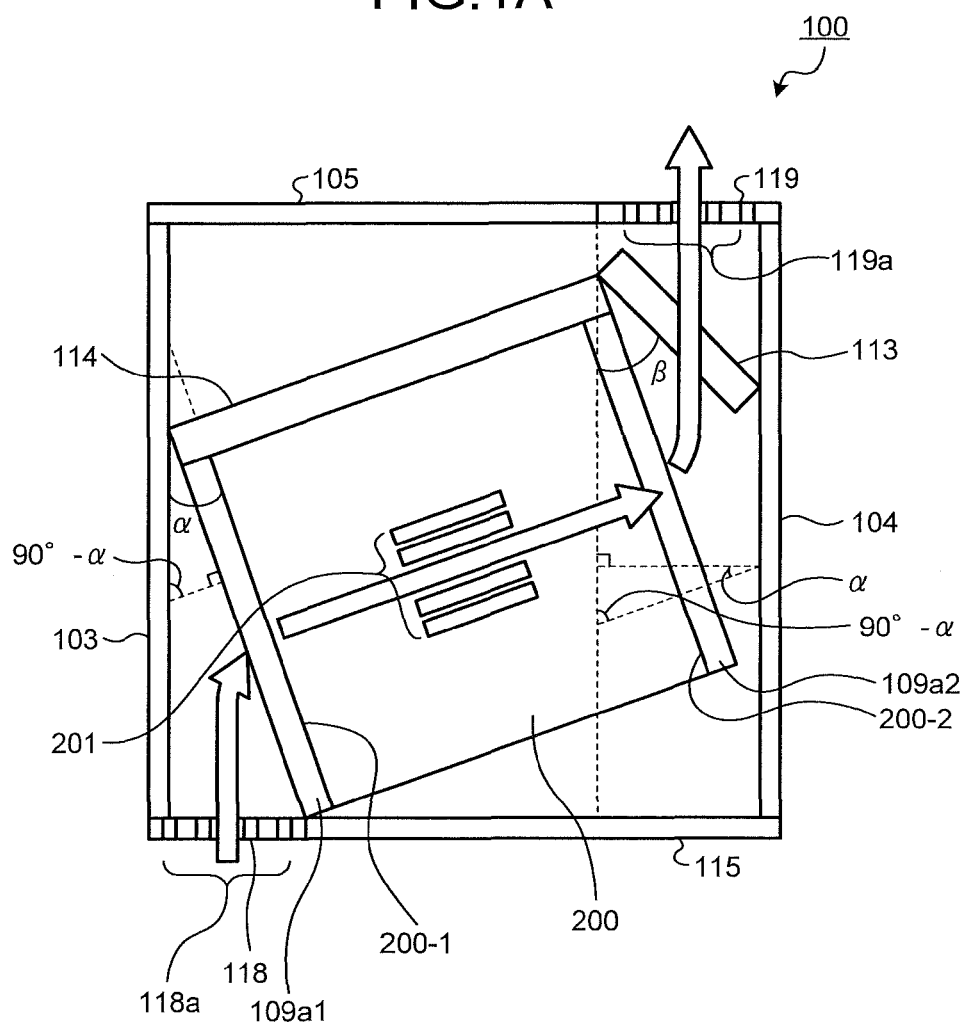
FIG. 1A is a sectional view of a casing for an electronic device according to an example of the first embodiment.
Figure 1B:
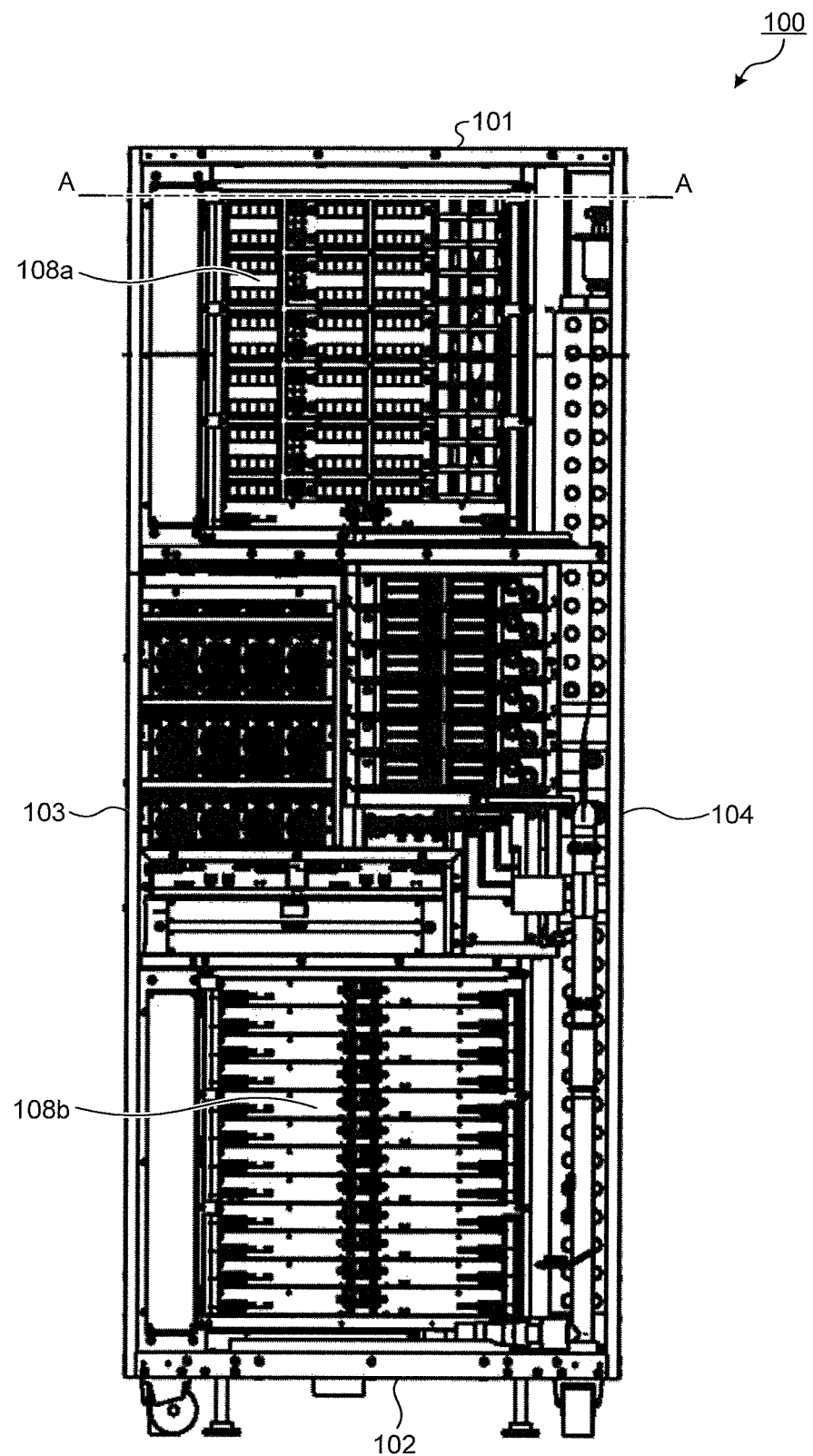
FIG. 1B is a schematic diagram illustrating the location, in the vertical direction, of the casing for the electronic device illustrated in FIG. 1A using a sectional view.

FIG. 1A is a sectional view of a casing for an electronic device according to an example of the first embodiment. FIG. 1B is a schematic diagram illustrating the location, in the vertical direction, of the casing for the electronic device illustrated in FIG. 1A using a sectional view. FIG. 1B is a front view of a casing for the electronic device according to an example of the first embodiment.

(Configuration of the Casing According to an Example of the First Embodiment)

In FIG. 1B, a casing 100 includes a top plate 101, a base plate 102, the first side surface plate 103, a second side surface plate 104, a shelf 108a, and a shelf 108b. FIG. 1B illustrates the casing 100 in the state in which the front surface plate 115, which will be described later, that is an openable and closable door arranged on the front side of the casing 100 is opened; however, the front surface plate 115 is not illustrated. FIG. 1A is a sectional view of the casing 100 taken along line A-A in FIG. 1B. The casing 100 may also be formed from a sheet metal material. Alternatively, the casing 100 may also be formed from a resin material.

As will be described later, the shelf 108a and the shelf 108b each include two guide panels 109a1 and 109a2 that each have the same number of combinations of guide rails that are arranged in parallel. The guide panels 109a1 and 109a2 are arranged such that the locations of a bottom surface, a top surface, and a horizontal surface of each of the guide rails are the same and such that the guide panels 109a1 and 109a2 are arranged perpendicular to the base plate 102, thereby the guide rails face each other.

By arranging the printed circuit board 200 on multiple guide rails facing each other, multiple printed circuit boards 200 are arranged on each of the shelf 108a and the shelf 108b in a layered manner. The sectional view, illustrated in FIG. 1A, of the casing 100 taken along line A-A in FIG. 1B is a schematic diagram illustrating, in an exposed manner, the printed circuit board 200 arranged on the top layer on the shelf 108a.

Because multiple printed circuit boards 200 are arranged on the shelf 108a in a layered manner, a sectional view taken along any line is the same as that illustrated in FIG. 1A as long as the line is parallel to line A-A in FIG. 1B and the line divides the shelf 108a such that the printed circuit board 200 is exposed.

As illustrated in FIG. 1A, the casing 100 includes the front surface plate 115 that has an air intake port 118a on an air intake surface 118 of the front surface plate 115; an air discharge surface 119 that has an air discharge port 119a; and the back surface plate 105 arranged opposite the front surface plate 115. Furthermore, the casing 100 also includes the first side surface plate 103 arranged perpendicular to the base plate 102 and the second side surface plate 104 arranged opposite the first side surface plate 103.

The front surface plate 115, the back surface plate 105, the first side surface plate 103, and the second side surface plate 104 are arranged perpendicular to the base plate 102 of the casing 100. Specifically, in the casing 100, the top plate 101, the base plate 102, the first side surface plate 103, the second side surface plate 104, the front surface plate 115, and the back surface plate 105 are arranged to form a cuboidal shape.

(Arrangement of the Printed Circuit Board According to the First Embodiment)

The printed circuit boards 200 are arranged inside the casing 100 surrounded by the front surface plate 115, the back surface plate 105, the first side surface plate 103, and the second side surface plate 104.

The printed circuit boards 200 each include a heat-generating component 201. The heat-generating component 201 is, for example, a RAM, a power supply apparatus, or the like. Alternatively, there may also be a heat-dissipating component, such as a heat sink, having a fin that dissipates heat generated by the heat-generating component 201. In the casing 100, the guide panel 109a1 and the guide panel 109a2 that is arranged opposite the guide panel 109a1, which are included in the shelf 108a, are arranged.

Furthermore, in the casing 100, a connecting circuit board 114 is arranged perpendicular to the base plate 102 of the casing 100. Furthermore, in the casing 100, a cooling device 113 is arranged perpendicular to the base plate 102 of the casing 100. In the casing 100, the cooling device 113 generates cooling air flowing from the air intake port 118a arranged on the air intake surface 118 to the air discharge port 119a arranged on the air discharge surface 119. The cooling device 113 is, for example, an axial fan.

The printed circuit board 200 is arranged on the guide rails of the guide panel 109a1 and the guide panel 109a2 that face each other and is connected to the connecting circuit board 114. The printed circuit board 200 has a rectangular or square shape including a first side 200-1 and a second side 200-2.

On the printed circuit board 200, the first side 200-1 is arranged on a guide rail of the guide panel 109a1 and the second side 200-2 is arranged on a guide rail of the guide panel 109a2. The printed circuit board 200 is arranged on the shelf 108a in this way. Similarly, the printed circuit board 200 is arranged on the shelf 108b.

The printed circuit board 200 is arranged on the shelf 108a such that the first side 200-1 is arranged to have a first angle of $\alpha°$ ($0°<\alpha<90°$) with respect to the first side surface plate 103. The cooling device 113 is arranged to have a second angle of $\beta$ ($0°\leq\beta\leq90°$) with respect to the first side surface plate 103.

(Advantage of the Example of the First Embodiment)

When the printed circuit board 200 is arranged such that the first side 200-1 is arranged to have the first angle of $\alpha°$ with respect to the first side surface plate 103, when compared with a case in which the printed circuit board 200 is arranged parallel to the first side surface plate 103, the angle of the change in the flow direction of the cooling air flowing from the air intake port 118a to the air discharge port 119a is small.

Specifically, when the printed circuit board 200 is arranged such that the first side 200-1 is arranged parallel to the first side surface plate 103, the cooling air flowing from the air intake port 118a changes its flow direction to the vertical direction with respect to the first side 200-1. The angle of the change in the flow direction of the cooling air at this time is 90°.

In contrast, when the printed circuit board 200 is arranged such that the first side 200-1 is arranged to have the first angle of $\alpha°$ with respect to the first side surface plate 103, the angle of the change in the flow direction of the cooling air is less than ($90°-\alpha°$). Accordingly, by reducing the angle of the change in the flow direction of the cooling air, the cooling air flowing from the air intake port 118a may be made to efficiently flow over the printed circuit board 200.

Similarly, when the printed circuit board 200 is arranged such that the first side 200-1 is arranged parallel to the first side surface plate 103, when the cooling air flowing over the printed circuit board 200 is discharged outside of the casing 100, the cooling air changes its flow direction to the vertical direction with respect to the air discharge surface 119. The angle of the change in the flow direction of the cooling air at this time is 90°, which includes the angle of the change in the flow direction of the cooling air due to the cooling device 113.

In contrast, when the printed circuit board 200 is arranged such that the first side 200-1 is arranged to have the first angle of $\alpha°$ with respect to the first side surface plate 103, the angle of the change in the flow direction of the cooling air is less than ($90°-\alpha°$), which includes the angle of the change in the flow direction of the cooling air due to the cooling device 113. Accordingly, by reducing the angle of the change in the flow direction of the cooling air, the cooling air flowing over the printed circuit board 200 may be made to efficiently flow through the air discharge port 119a.

Furthermore, when the printed circuit board 200 is arranged such that the first side 200-1 is arranged to have the first angle of $\alpha°$ with respect to the first side surface plate 103, when compared with a case in which the printed circuit board 200 is arranged parallel to the first side surface plate 103, the length of the air intake surface 118 and the air discharge surface 119 in the horizontal direction may be longer. Specifically, it is possible to arrange a greater number of air intake ports 118a and air discharge ports 119a on the air intake surface 118 and the air discharge surface 119, respectively. Accordingly, by increasing the amount of the cooling air flowing in and out via the air intake port 118a and the air discharge port 119a, respectively, the efficiency with which the heat-generating component 201 on the printed circuit board 200 is cooled may be improved.

Furthermore, when the printed circuit board 200 is arranged such that the first side 200-1 is arranged to have the first angle of $\alpha°$ with respect to the first side surface plate 103, when compared with a case in which the printed circuit board 200 is arranged parallel to the first side surface plate 103, the space around the air discharge surface 119 is larger. Accordingly, when compared with a case in which the first side 200-1 is arranged parallel to the first side surface plate 103, the cooling device 113 may be arranged. Alternatively, because the space around the air discharge surface 119 is larger, it is possible to arrange a large cooling device 113 capable of providing a large air volume or multiple cooling devices 113. Accordingly, the efficiency with which the heat-generating component 201 on the printed circuit board 200 is cooled may be improved.

Furthermore, when the cooling device 113 is arranged to have the second angle of $\beta$ with respect to the first side surface plate 103, when compared with a case in which the printed circuit board 200 is arranged parallel to the first side surface plate 103, the size of an air intake surface of the cooling device 113 that faces the printed circuit board 200 increases. Accordingly, the efficiency of the air flowing in and out of the cooling device 113 may be improved; therefore, the efficiency with which the heat-generating component 201 on the printed circuit board 200 is cooled may be improved.

[b] Second Embodiment

Figure 2A:
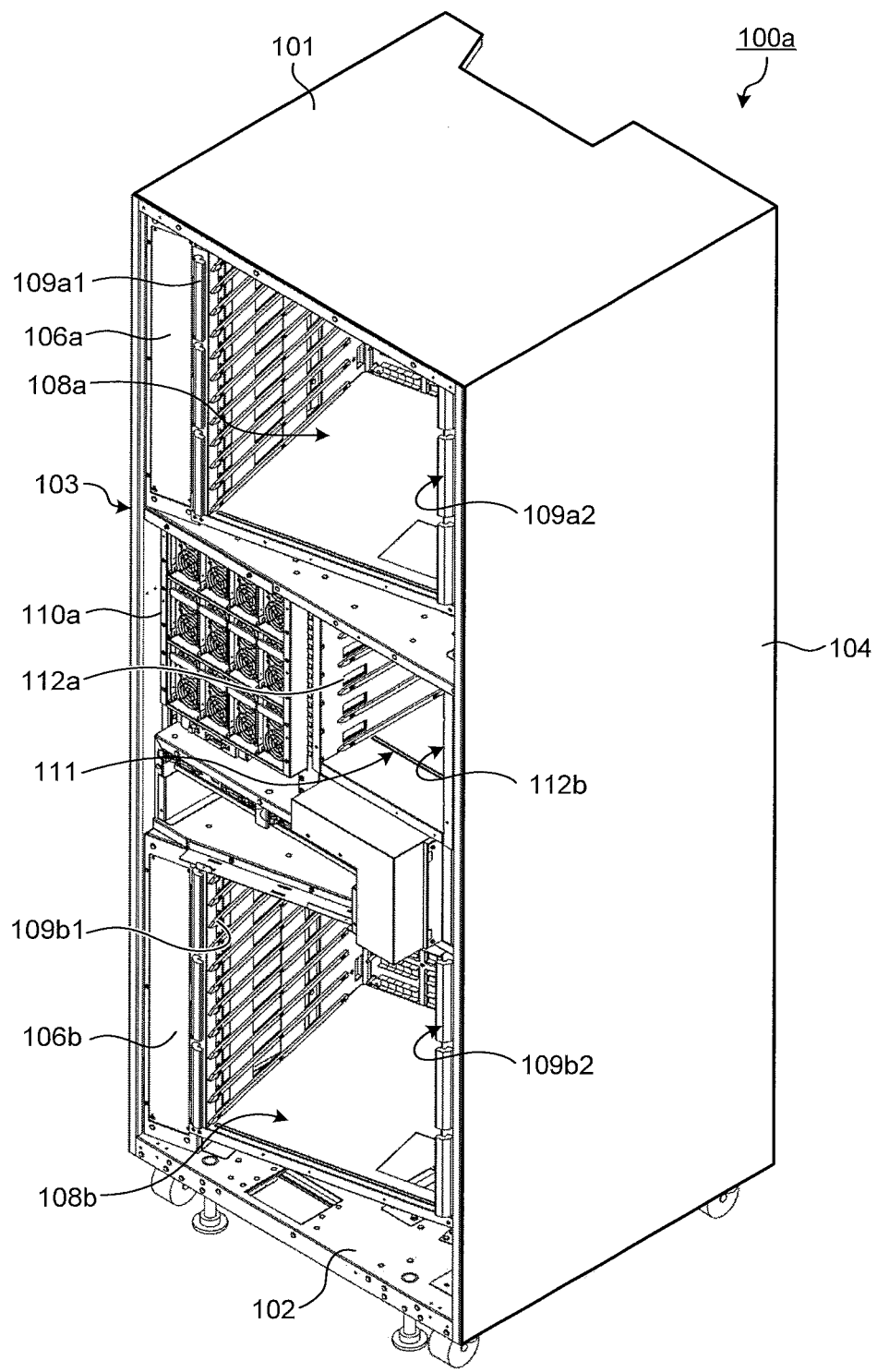
FIG. 2A is a perspective view, from the front, of a casing for an electronic device according to an example of a second embodiment.
Figure 2B:
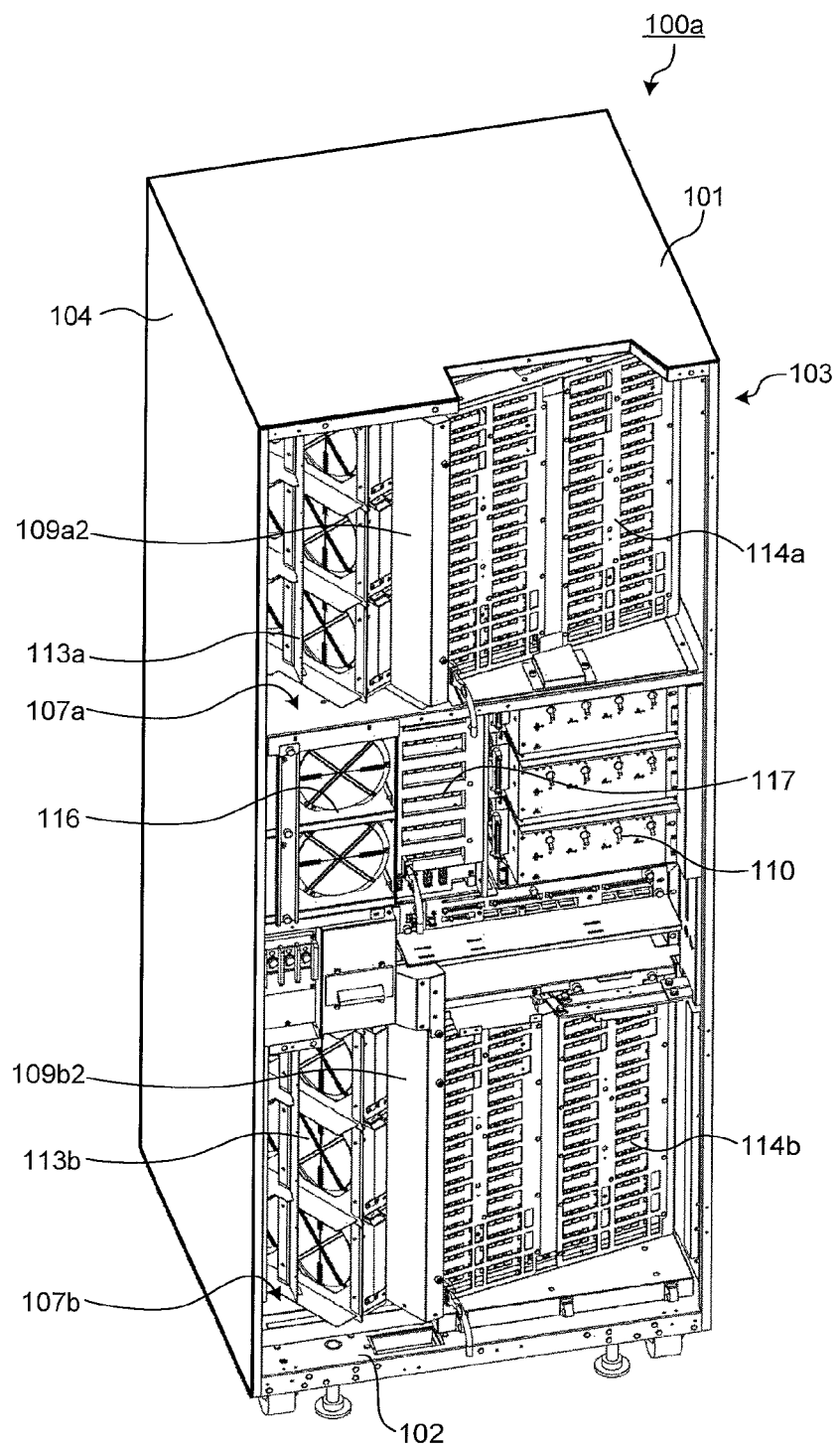
FIG. 2B is a perspective view, from the back, of the casing for the electronic device according to an example of the second embodiment.

FIG. 2A is a perspective view, from the front, of a casing for an electronic device according to an example of a second embodiment. FIG. 2B is a perspective view, from the back, of a casing 100a of the electronic device according to an example of the second embodiment. In the casing 100a for the electronic device according to an example of the second embodiment, elements that have the same configuration as those in the casing 100 for the electronic device according to the first embodiment are assigned the same reference numerals.

FIG. 2A illustrates the casing 100a in the state in which the front surface plate 115 that is an openable and closable door arranged on the front side of the casing 100 is opened; however, the front surface plate 115 is not illustrated. Furthermore, in FIG. 2B, the back surface plate 105 included in the casing 100a is not illustrated.

(Configuration of the Casing According to an Example of the Second Embodiment)

As illustrated in FIGS. 2A and 2B, the casing 100a for the electronic device according to an example of the second embodiment includes the top plate 101, the base plate 102, the first side surface plate 103, the second side surface plate 104, the shelf 108a, and the shelf 108b.

The base plate 102 is arranged parallel to the arrangement surface of the casing 100a. The first side surface plate 103 and the second side surface plate 104 are arranged perpendicular to the base plate 102. The top plate 101 is arranged perpendicular to the first side surface plate 103 and the second side surface plate 104.

The casing 100a includes the front surface plate 115 (not illustrated) and the back surface plate 105 (not illustrated) that is arranged opposite the front surface plate 115. The front surface plate 115 is an openable and closable door that is arranged to cover the rectangular opening, which is formed on the front side of the casing 100a and is formed by the top plate 101, the base plate 102, the first side surface plate 103, and the second side surface plate 104.

The back surface plate 105 is an openable and closable door that is arranged to cover the rectangular opening, which is formed on the back side of the casing 100a and is formed by the top plate 101, the base plate 102, the first side surface plate 103, and the second side surface plate 104.

(Front Perspective View of the Casing for the Electronic Device According to an Example of the Second Embodiment)

In the following, a description will be given with reference to FIG. 2A. The casing 100a includes the shelf 108a and the shelf 108b in a space that is bounded by the first side surface plate 103 and the second side surface plate 104, respectively. Printed circuit board units 200a that include printed circuit boards 200 are arranged on each of the shelf 108a and the shelf 108b in a blade-shaped casing. The printed circuit boards 200 and the printed circuit board units 200a are referred to as a system board.

The shelf 108a includes the guide panel 109a1 and the guide panel 109a2 (not illustrated) that each have the same number of combinations of guide rails that are arranged in parallel. The shelf 108b includes a guide panel 109b1 and a guide panel 109b2 that each have the same number of combinations of guide rails that are arranged in parallel.

The guide panel 109a1 and the guide panel 109a2 are arranged such that the locations of a bottom surface of the guide panel and a horizontal surface of each of the guide rails are the same and such that the guide rails are arranged perpendicular to the base plate 102, thereby the guide rails face each other. The guide panel 109b1 and the guide panel 109b2 are arranged in the same manner as the guide panel 109a1 and the guide panel 109a2.

Then, in the casing 100, the shelf 108a and the shelf 108b are arranged such that the guide panel 109a1 and the guide panel 109b1 are arranged to have the first angle of $\alpha°$ ($0°<\alpha<90°$) with respect to the first side surface plate 103 in the horizontal direction. By arranging the printed circuit board units 200a, which will be described later, on the multiple guide rails that face each other, it is possible to arrange the multiple printed circuit board units 200a on each of the shelf 108a and the shelf 108b in a layered manner. Accordingly, the printed circuit board units 200a are arranged to have the first angle of $\alpha°$ ($0°<\alpha<90°$) with respect to the first side surface plate 103 in the horizontal direction.

On the front side of the casing 100a, an air intake duct opening 106a is arranged in the space bounded by the shelf 108a and the first side surface plate 103. Similarly, on the front side of the casing 100a, an air intake duct opening 106b is arranged in the space bounded by the shelf 108b and the first side surface plate 103.

A power supply apparatus 110 and a shelf 111 are arranged, in the vertical direction of the casing 100a, between the shelf 108a and the shelf 108b. The power supply apparatus 110 is arranged on the first side surface plate 103 side, whereas the shelf 111 is arranged on the second side surface plate 104 side.

The power supply apparatus 110 controls the power supply supplied to the electronic device arranged in the casing 100a in which electronic components are mounted on multiple printed circuit boards. On the shelf 111, multiple interface units are arranged, in which a printed circuit board, i.e., a connecting interface, that is used by an electronic device in order to transmit and receive data to/from an external unit is arranged in a blade-shaped casing. The connecting interface or the interface unit is referred to as an input/output (IO) system board.

The shelf 111 includes a guide panel 112a and a guide panel 112b (not illustrated) that each have the same number of combinations of guide rails that are arranged in parallel. The guide panel 112a and the guide panel 112b are arranged such that the locations of a bottom surface of the guide panel and a horizontal surface of each of the guide rails are the same and such that the guide rails are arranged perpendicular to the base plate 102, thereby the guide rails face each other.

By arranging interface units on the multiple guide rails, which are arranged on the guide panel 112a and the guide panel 112b and face each other, it is possible to arrange multiple interface units on the shelf 111 in a layered manner.

(Back Surface Perspective View of the Casing for the Electronic Device According to an Example of the Second Embodiment)

In the following, a description will be given with reference to FIG. 2B. In the casing 100a, a connecting circuit board 114a referred to as a back plane is arranged on the back surface of the shelf 108a. The connecting circuit board 114a is arranged perpendicular to the guide panel 109a1 and the guide panel 109a2. On the back surface of the shelf 108a, the connecting circuit board 114a is arranged to cover the rectangular opening that is formed using the guide panel 109a1 and the guide panel 109a2.

The connecting circuit board 114a electrically connects the printed circuit board 200 included in each of the multiple printed circuit board units 200a arranged on the shelf 108a. By connecting multiple connecting terminals of the printed circuit boards 200 arranged on the back surface of the casing for the multiple printed circuit board units 200a to the connecting circuit board 114a, the multiple printed circuit board units 200a are electrically connected.

Because the first side 200-1 of the printed circuit board 200 is arranged to have an angle of α° with respect to the first side surface plate 103 in the horizontal direction, the connecting circuit board 114a is arranged to have an angle of 90°±α° with respect to the first side surface plate 103 in the horizontal direction.

on the back surface of the casing 100a, an air discharge duct opening 107a is arranged in the space bounded by the second side surface plate 104 and the guide panel 109a2. In the casing 100a, cooling devices 113a are arranged in the space formed between the second side surface plate 104 and the guide panel 109a2. The cooling device 113a is formed by arranging, in the vertical and the horizontal directions, multiple fans having the same structure. The fans are typically axial fans. The cooling device 113a is arranged to have the second angle of β° (0°≤β≤90°) with respect to the first side surface plate 103.

Similarly, in the casing 100a, a connecting circuit board 114b referred to as a back plane is arranged on the back surface of the shelf 108b. The connecting circuit board 114b is arranged perpendicular to the guide panel 109b1 and the guide panel 109b2. Furthermore, on the back surface of the shelf 108a, the connecting circuit board 114b is arranged to cover the rectangular opening formed using the guide panel 109b1 and the guide panel 109b2.

In a similar manner to the connecting circuit board 114a, the connecting circuit board 114b electrically connects the printed circuit boards 200 included in each of the multiple printed circuit board units 200a that are arranged on the shelf 108b. In a similar manner to the connecting circuit board 114a, the connecting circuit board 114b is arranged to have an angle of 90°±α° with respect to the first side surface plate 103 in the horizontal direction.

On the back surface of the casing 100a, an air discharge duct opening 107b is arranged in the space bounded by the second side surface plate 104 and the guide panel 109b2. In the casing 100a, a cooling device 113b is arranged in the space formed between the second side surface plate 104 and the guide panel 109b2. In a similar manner to the cooling device 113a, the cooling device 113b is formed by arranging, in the vertical and the horizontal directions, multiple fans having the same structure. The cooling device 113b is arranged to have the second angle of β° (0°≤β≤90°) with respect to the first side surface plate 103.

In the casing 100a, a cooling device 116 and a connecting circuit board 117 are arranged side by side on the back surface of the shelf 111. The cooling device 116 cools an electronic component mounted on a printed circuit board arranged in the casing for multiple interface units arranged on the shelf 111. The connecting circuit board 117 is a back plane that electrically connects printed circuit board arranged in the casing for the multiple interface units arranged on the shelf 111. The power supply apparatus 110 is arranged between the connecting circuit board 117 and the first side surface plate 103.

Figure 2C:
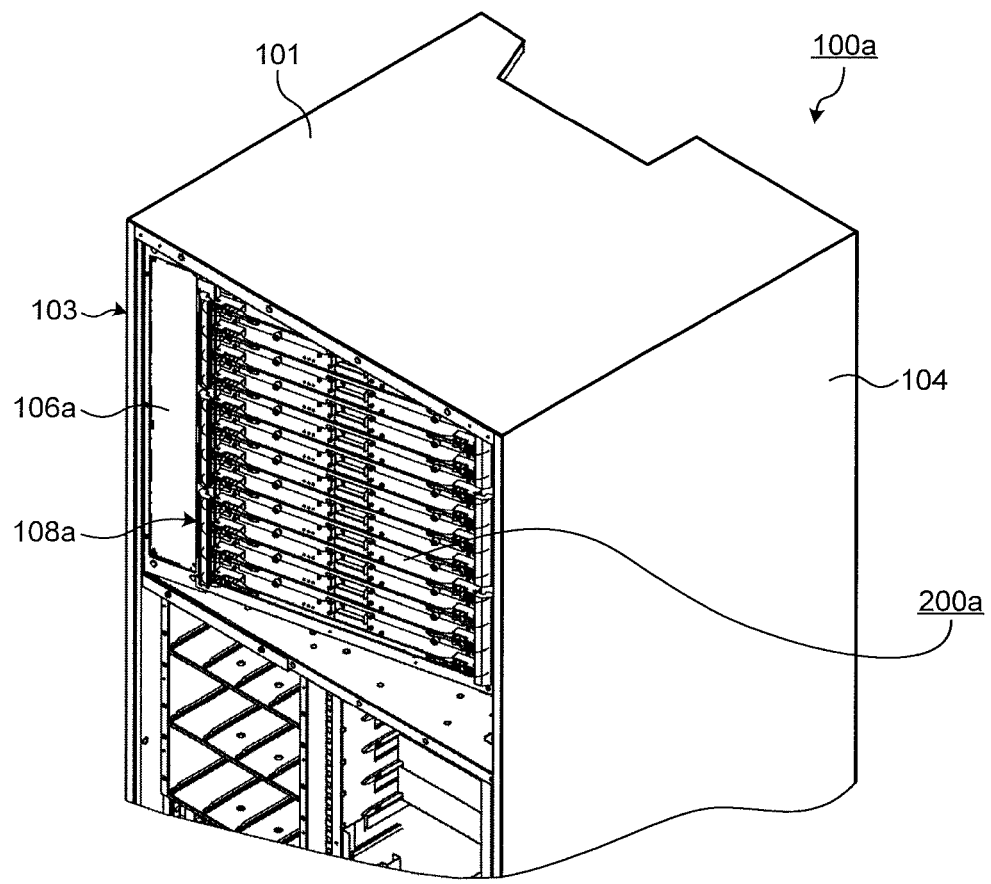
FIG. 2C is a perspective view, from the front, of a part of the casing having mounted thereon multiple printed circuit board units that are included in the electronic device according to the example of the second embodiment.

FIG. 2C is a perspective view, from the front, of a part of the casing having mounted thereon the multiple printed circuit board units that are included in the electronic device according to the example of the second embodiment. As illustrated in FIG. 2C, the multiple printed circuit board units 200a are arranged, on the shelf 108a, in the space formed by the top plate 101, the first side surface plate 103, and the second side surface plate 104. On the shelf 108a, the multiple printed circuit board units 200a are arranged such that the front surfaces of the printed circuit board units 200a are aligned in the same plane. The shelf 108b is arranged in a similar manner to the shelf 108a.

Figure 2D:
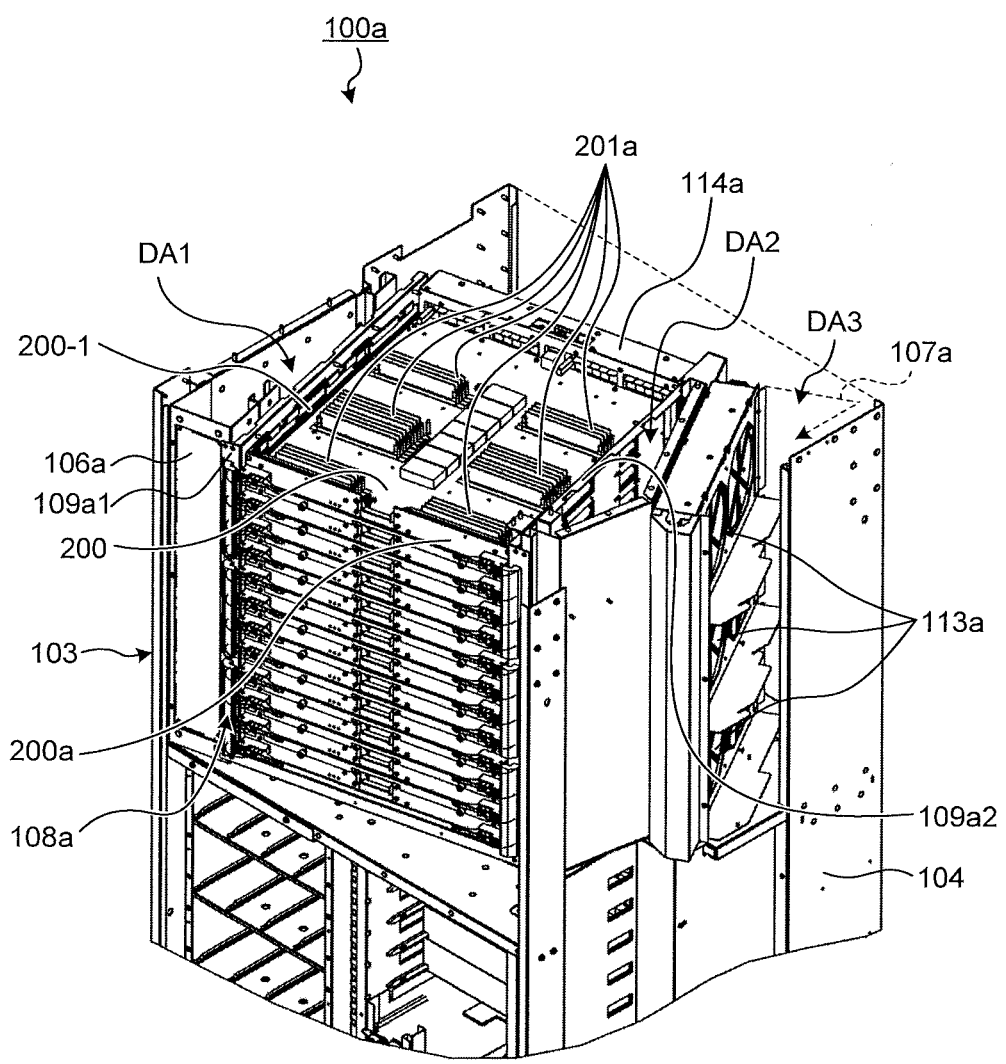
FIG. 2D is a perspective view, from the front, of a part of the inside of the casing having mounted thereon the printed circuit board units that are included in the electronic device according to the example of the second embodiment.

FIG. 2D is a perspective view, from the front, of a part of the inside of the casing having mounted thereon the printed circuit board units that are included in the electronic device according to the example of the second embodiment. FIG. 2D illustrates the state obtained by removing the top plate 101 and the top plate of the casing for the printed circuit board unit 200a arranged on the top layer on the shelf 108a from the state illustrated in FIG. 2C.

As illustrated in FIG. 2D, the multiple printed circuit board units 200a arranged on the shelf 108a are arranged such that the first side 200-1 is arranged to have an angle with respect to the first side surface plate 103 in the horizontal direction and are electrically connected to the connecting circuit board 114a. The space bounded by the first side surface plate 103 and the guide panel 109a1 on the shelf 108a is an air intake duct area DA1. The air intake duct opening 106a is arranged in the air intake duct area DA1 on the front surface of the casing 100a.

The cooling device 113a illustrated in FIG. 2D is arranged, in the space bounded by the shelf 108a and the second side surface plate 104, at an angle of β° with respect to the first side surface plate 103 in the horizontal direction. The space bounded by the shelf 108a, the guide panel 109a2 of the shelf 108a, and the cooling device 113a is an intermediate duct area DA2. The space bounded by the cooling device 113a and the second side surface plate 104 illustrated in FIG. 2D is an air discharge duct area DA3. The air discharge duct opening 107a is arranged in the air discharge duct area DA3 on the back surface of the casing 100a. The air intake duct area DA1, the intermediate duct area DA2, and the air discharge duct area DA3 are referred to as a cooling duct.

A dual inline memory module (DIMM) 201a, functioning as a heat-generating electronic component, is mounted on the printed circuit board 200. The DIMM is a type of RAM module in which a high integrated semiconductor memory elements are mounted on both sides of a rectangular-plate shaped circuit board. The DIMM 201a is arranged on the printed circuit board 200 such that the circuit board of the DIMM 201a is arranged perpendicular to the first side 200-1 of the printed circuit board 200.

In FIG. 2D, by operating the cooling device 113a, the cooling air flowing from the air intake duct opening 106a into the casing 100a changes its flow direction, in the air intake duct area DA1, toward the printed circuit board 200. Then, the cooling air that has changed its flow direction toward the printed circuit board 200 cools the DIMM 201a and flows over the printed circuit board 200.

The cooling air flowing over the printed circuit board 200 changes its flow direction, in the intermediate duct area DA2, toward the cooling device 113a. Then, the cooling air that has changed its flow direction toward the cooling device 113a flows through the cooling device 113a and is discharged outside of the casing 100a from the air discharge duct opening 107a via the air discharge duct area DA3.

(Printed Circuit Board Unit According to an Example of the Second Embodiment)

Figure 3A:
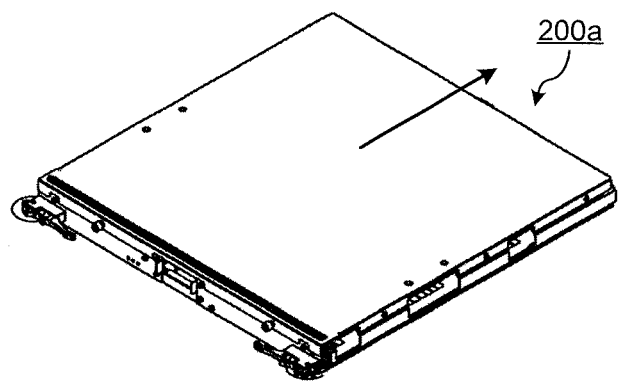
FIG. 3A is a perspective view of the printed circuit board unit according to the example of the second embodiment.

FIG. 3A is a perspective view of the printed circuit board unit according to the example of the second embodiment. The printed circuit board unit 200a according to an example of the second embodiment is a blade type in which the printed circuit board 200 is arranged in a cuboidal casing. Each of the printed circuit board units 200a is stored on the shelf 108a or the shelf 108b in the direction indicated by the arrow illustrated in FIG. 3A and is connected to the connecting circuit board 114a or 114b.

(Cooling Device According to an Example of the Second Embodiment)

Figure 3B:
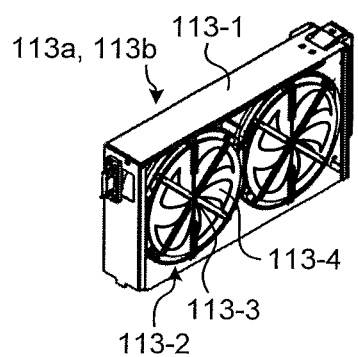
FIG. 3B is a perspective view of a cooling device according to an example of the second embodiment.

FIG. 3B is a perspective view of a cooling device according to an example of the second embodiment. In the cooling devices 113a and 113b according to an example of the second embodiment, at least one fan 113-2 is arranged in a rectangular or a square shaped frame 113-1. The fan 113-2 includes a rotational shaft 113-3 that is rotated by power of a built-in motor and includes a vane portion 113-4 that is attached so as to be freely rotatable relative to the rotational shaft 113-3. The cooling devices 113a and 113b draw in and discharge the cooling air by rotating the vane portion 113-4.

(Connecting Circuit Board According to an Example Of the Second Embodiment)

Figure 3C:
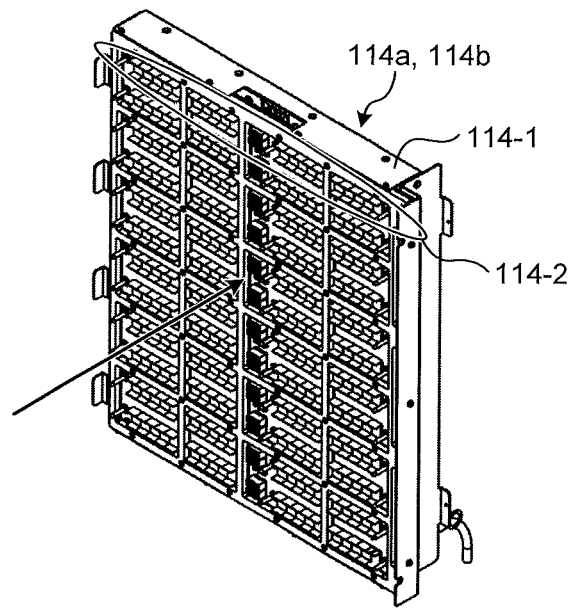
FIG. 3C is a perspective view of a connecting circuit board according to an example of the second embodiment.

FIG. 3C is a perspective view of a connecting circuit board according to an example of the second embodiment. On the connecting circuit boards 114a and 114b according to an example of the second embodiment, a multiple connecting portions 114-2 are arranged on the surface of a rectangular or a square shaped frame 114-1, on which the printed circuit board 200 is connected. A connecting terminal of a single printed circuit board 200 is connected to the single connecting portion 114-2 in the direction indicated by the arrow illustrated in FIG. 3C. In the same manner, all of the multiple printed circuit boards 200 are connected to the connecting circuit boards 114a and 114b.

Figure 4:
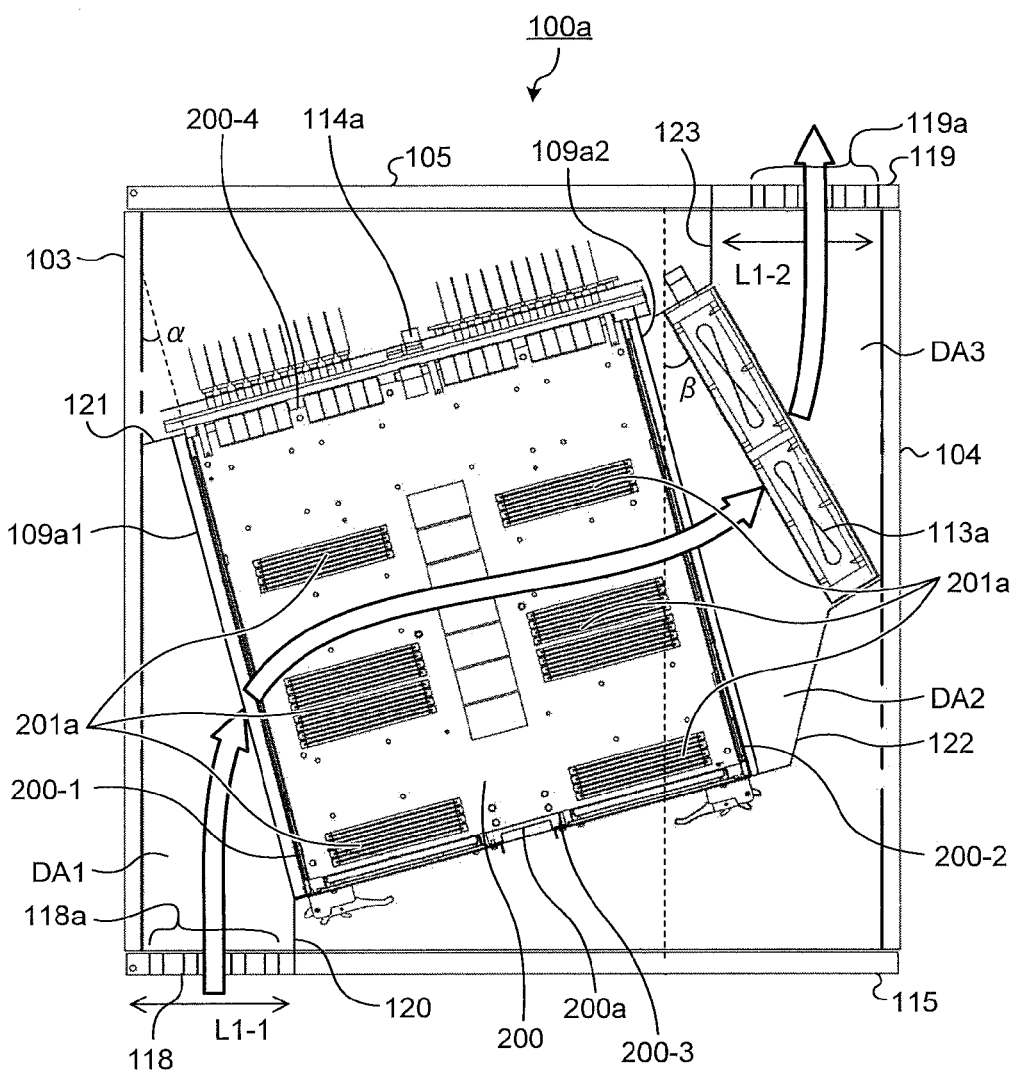
FIG. 4 is a sectional view, in the horizontal direction, of the casing for the electronic device according to an example of the second embodiment.

FIG. 4 is a sectional view, in the horizontal direction, of the casing for the electronic device according to an example of the second embodiment. FIG. 4 is a sectional view of the casing 100a taken along line A-A in FIG. 1B or taken along a line that is parallel to line A-A and that divides the shelf 108a such that the printed circuit board 200 is exposed. Similarly, the sectional view of the casing 100a taken along the line that is parallel to line A-A in FIG. 1B and that divides the shelf 108b such that the printed circuit board 200 is exposed is the same as that illustrated in FIG. 4.

(Arrangement of a Printed Circuit Board According to an Example of the Second Embodiment)

As illustrated in FIG. 4, the casing 100a includes the front surface plate 115 that has the air intake port 118a on the air intake surface 118; the air discharge surface 119 that has the air discharge port 119a; and the back surface plate 105 that opposes the front surface plate 115. Furthermore, the casing 100a also includes the first side surface plate 103 arranged perpendicular to the base plate 102 and the second side surface plate 104 that opposes the first side surface plate 103.

The printed circuit board units 200a, which store therein the printed circuit boards 200 on which the DIMMs 201a are arranged, are arranged inside the casing 100a surrounded by the front surface plate 115, the back surface plate 105, the first side surface plate 103, and the second side surface plate 104. Each of the DIMMs 201a is arranged such that the circuit board of the DIMM 201a is perpendicular to the first side 200-1 and the second side 200-2. The guide panel 109a1 and the guide panel 109a2 that opposes the guide panel 109a1, which are included in the shelf 108a, are arranged in the casing 100a for the printed circuit board 200.

Furthermore, in the casing 100a, the connecting circuit board 114a is arranged perpendicular to the base plate 102 of the casing 100a. Furthermore, in the casing 100a, the cooling device 113a is arranged perpendicular to the base plate 102 of the casing 100a. In the casing 100a, the cooling device 113a generates cooling air flowing from the air intake port 118a arranged on the air intake surface 118 to the air discharge port 119a arranged on the air discharge surface 119.

By arranging the circuit board of the DIMM 201a perpendicular to the first side 200-1 and the second side 200-2, the air drawn in by the cooling device 113a flows between a front side 200-3 and a rear side 200-4 of the printed circuit board 200.

The printed circuit board unit 200a is arranged on the guide rails of the guide panel 109a1 and the guide panel 109a2 that face each other and is then connected to the connecting circuit board 114a. Furthermore, the printed circuit board unit 200a is arranged such that the first side 200-1 of the printed circuit board 200 is arranged to have the first angle of $\alpha°$ ($0°<\alpha<90°$) with respect to the first side surface plate 103. The cooling device 113a is arranged to have the second angle of $\beta$ ($0°\leq\beta\leq90°$) with respect to the first side surface plate 103.

When the printed circuit board 200 is arranged such that the first side 200-1 is arranged to have the first angle of $\alpha°$ with respect to the first side surface plate 103, the lengths of the air intake surface 118 and the air discharge surface 119 in the horizontal direction are "L1-1" and "L1-2", respectively.

When the cooling device 113a is arranged, in the casing 100a, to have the second angle of $\beta$ ($\alpha°\leq\beta<90°$) with respect to the first side surface plate 103, when compared with a case of $\beta<\alpha°$ or $\beta=90°$, it is possible to use a larger or a multiplex cooling device. The reason for this is because, when a simple calculation is performed by ignoring the thickness of the cooling device 113a, the maximum width of the cooling device that may be arranged is "(L1-2)/sin $\beta$", which is greater when compared with the length of "L1-2".

As illustrated in FIG. 4, the cooling air draw in via the air intake port 118a changes its flow direction toward the printed circuit board 200 via the air intake duct area DA1 that is bounded by the first side surface plate 103 and duct walls 120 and 121.

Then, the cooling air that has changed its flow toward the printed circuit board 200 flows over the printed circuit board 200 and then changes its flow direction, due to being urged by the cooling device 113a, toward the cooling device 113a via the intermediate duct area DA2 that is bounded by a duct wall 122.

Then, the cooling air that has changed its flow direction toward the cooling device 113a is discharged outside from the air discharge port 119a via air discharge duct area DA3 that is bounded by the cooling device 113a, the second side surface plate 104, and the duct wall 123.

(Maintainability of the Electronic Device)

FIGS. 5A to 5D are schematic diagrams illustrating the maintainability of the electronic device according to an example of the second embodiment. The printed circuit board unit 200a, the cooling device 113a, and the connecting circuit board 114a, which are arranged in the casing 100a for the electronic device according to an example of the second embodiment, may be removed so that maintenance may be performed while the front surface plate 115 or the back surface plate 105 is released.

Figure 5A:
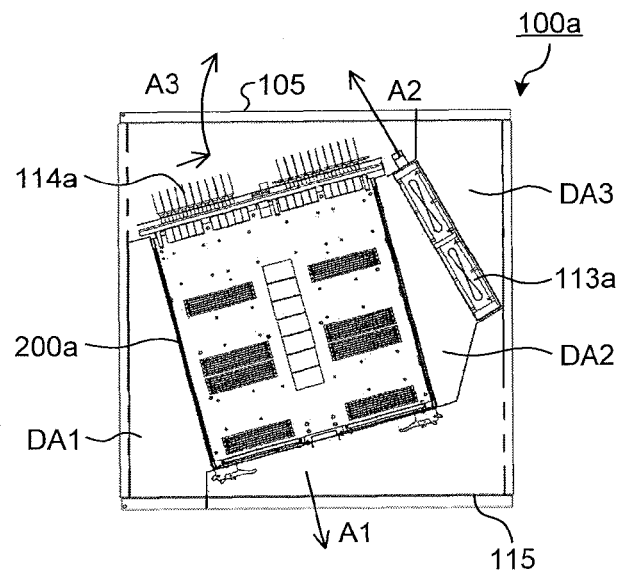
FIG. 5A is a schematic diagram illustrating the maintainability of the electronic device according to an example of the second embodiment.
Figure 5B:
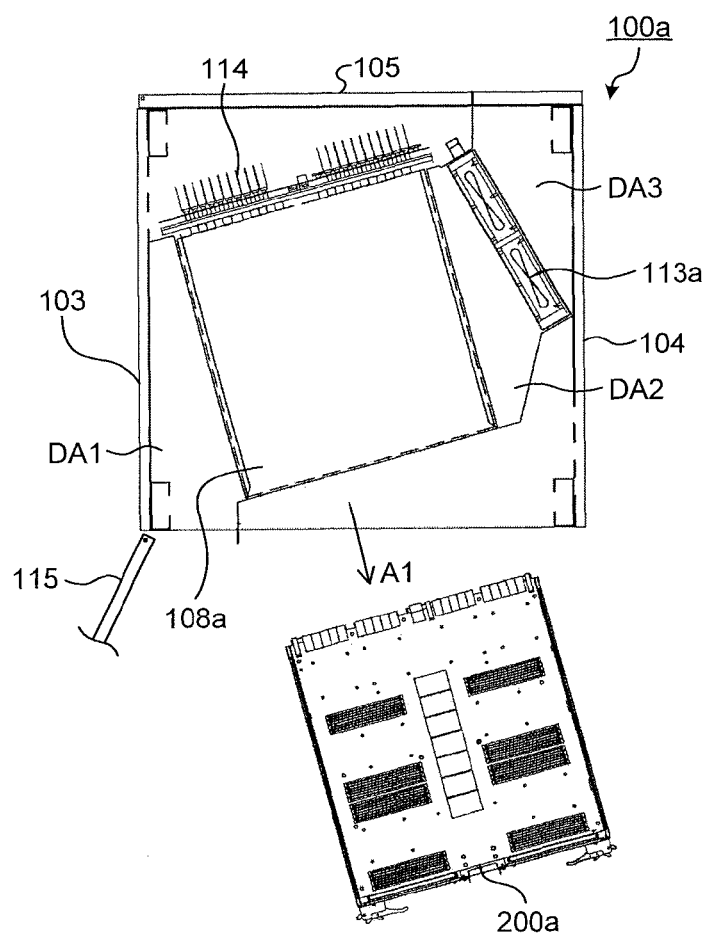
FIG. 5B is a schematic diagram illustrating the maintainability of the electronic device according to an example of the second embodiment.

As illustrated in FIG. 5A and FIG. 5B, by moving the printed circuit board unit 200a in the direction indicated by the arrow A1 while the front surface plate 115 is released, the connection to the connecting circuit board 114a is released, thus the printed circuit board unit 200a may be removed from the shelf 108a and the casing 100a.

Figure 5C:
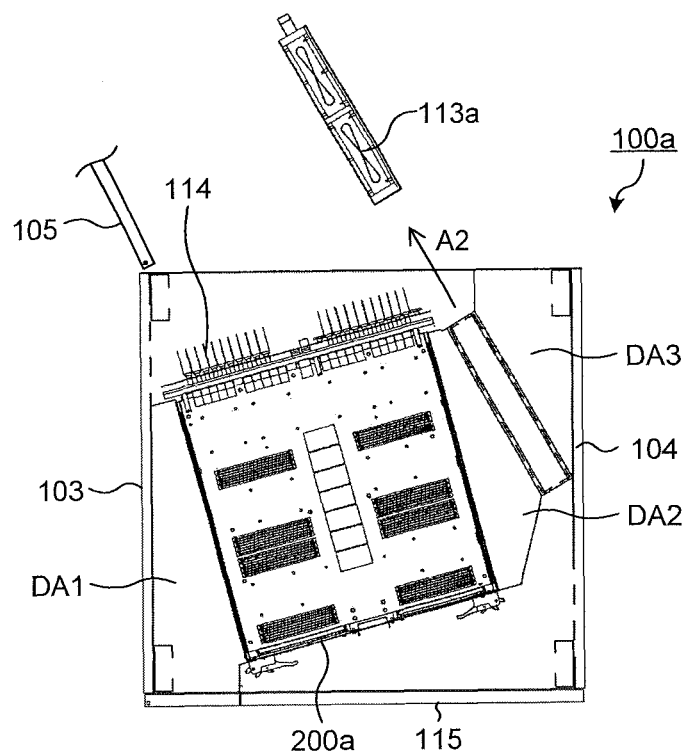
FIG. 5C is a schematic diagram illustrating the maintainability of the electronic device according to an example of the second embodiment.
Figure 5D:
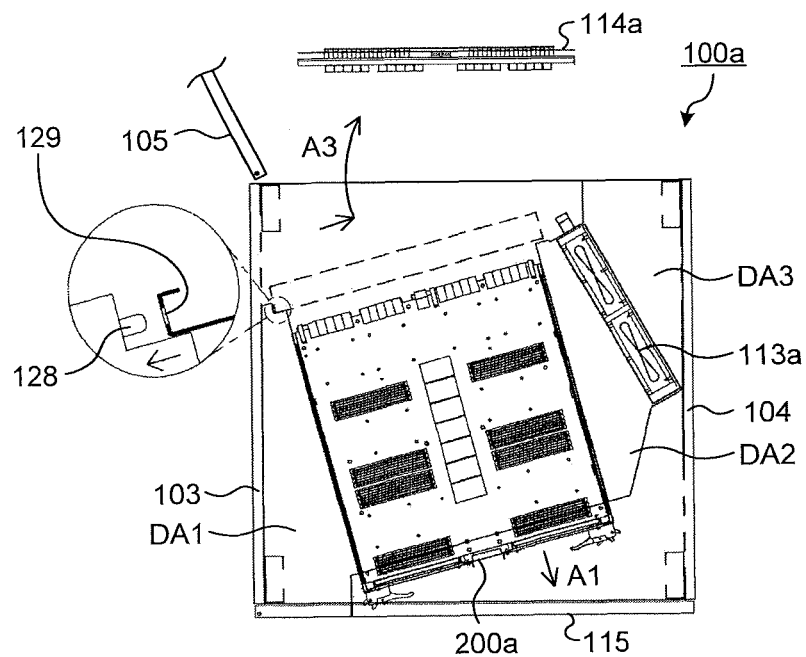
FIG. 5D is a schematic diagram illustrating the maintainability of the electronic device according to an example of the second embodiment.

Furthermore, as illustrated in FIGS. 5A and 5C, by moving the cooling device 113a in the direction indicated by the arrow A2 while the back surface plate 105 is released, the cooling device 113a may be removed from the casing 100a. Furthermore, as illustrated in FIGS. 5A and 5D, by moving the connecting circuit board 114a, while the back surface plate 105 is released and the printed circuit board unit 200a is moved in the direction indicated by the arrow A1, in the direction indicated by the arrow A3, the connecting circuit board 114a may be removed from the casing 100a.

The connecting circuit board 114a includes an engaging hole 129 that engages with a pin 128 that is arranged on the inner surface of the casing 100a of the first side surface plate 103. The connecting circuit board 114a includes the engaging hole 129 that is arranged on the frame 114-1 adjacent to the first side surface plate 103. The connecting circuit board 114a is secured to the first side surface plate 103 because the pin 128 engages with the engaging hole 129.

When removing the connecting circuit board 114a from the casing 100a, by first releasing the engagement of the pin 128 and the engaging hole 129, the connecting circuit board 114a is moved. Accordingly, as indicated by the arrow A3, the moving direction of the connecting circuit board 114a is changed during the movement.

As described with reference to FIGS. 5A to 5D, the printed circuit board unit 200a, the cooling device 113a, and the connecting circuit board 114a, which are arranged in the casing 100a for the electronic device according to an example of the second embodiment, may be easily removed from the casing 100a for the maintenance.

(Air Volume in Accordance with the Angle of the Arrangement of the Printed Circuit Board)

FIGS. 6A to 6D are schematic diagrams illustrating an example of the arrangement of the printed circuit board in the casing for the electronic device. Specifically, FIGS. 6A to 6D illustrate an example of the arrangement in which the printed circuit board is arranged to have an angle of $\alpha°$ with respect to the first side surface plate of the electronic device. The width of an air intake surface of an air intake duct in this example is 800 mm. The length of the first side in this example is 500 mm.

Figure 6A:
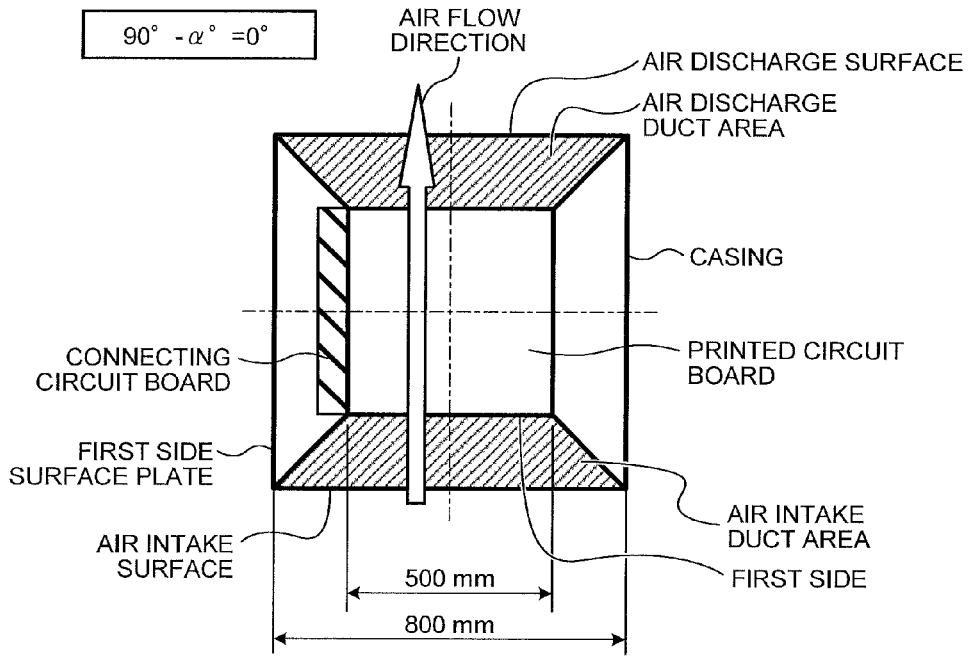
FIG. 6A is a schematic diagram illustrating an example of the arrangement of the printed circuit board in the casing for the electronic device.

FIG. 6A illustrates a case of $\alpha=90°$, i.e., a case in which the air flow direction of the cooling air flowing from the air intake duct to the air discharge duct is $(90°-\alpha°)=0°$. In such a case, the printed circuit board is arranged such that the first side is arranged to have an angle of 90° with respect to the first side surface plate.

As illustrated in FIG. 6A, the flow of the cooling air flowing from the air intake surface is not intercepted by a barrier, such as a connecting circuit board. The maximum width of the casing may be used for the air intake surface. Accordingly, it is possible to take in as much cooling air as possible and to make the cooling air efficiently flow over the printed circuit board without changing its flow direction. In other words, by arranging the printed circuit board to have an angle of 90° with respect to the first side surface plate, it is possible to efficiently cool the electronic component.

However, with the arrangement of the printed circuit board illustrated in FIG. 6A, the connecting direction of each of the printed circuit board and the connecting circuit board has an angle of 90° with respect to the front surface plate. Accordingly, even when detaching the front surface plate of the casing that is on the same plane as that of the air intake surface, the printed circuit board is not easily removed from the casing by releasing the connection between the printed circuit board and the connecting circuit board.

Figure 6B:
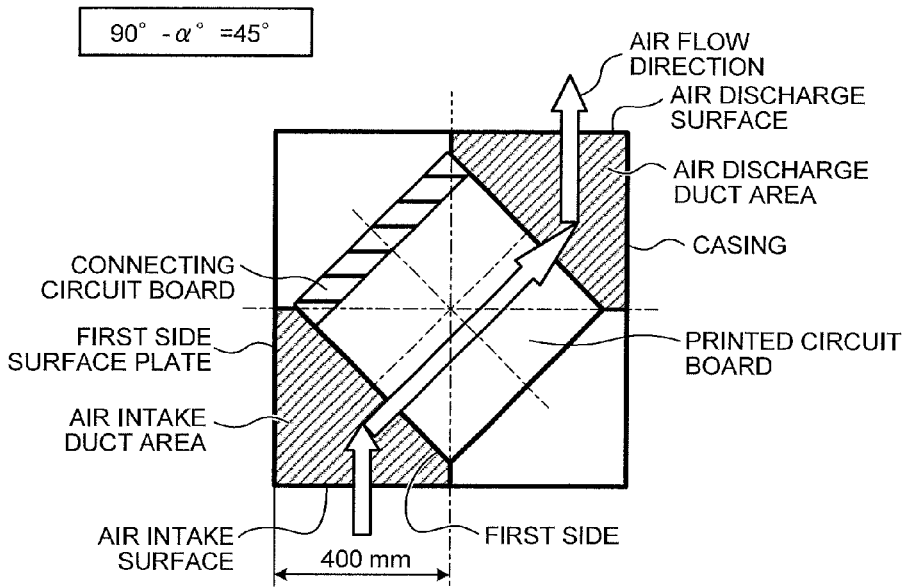
FIG. 6B is a schematic diagram illustrating an example of the arrangement of the printed circuit board in the casing for the electronic device.

Accordingly, as illustrated in FIG. 6B, the printed circuit board is arranged to have an angle of $\alpha=45°$, i.e., is arranged such that the air flow direction of the cooling air flowing from the air intake duct to the air discharge duct has an angle of $(90°-\alpha°)=45°$. In such a case, the printed circuit board is arranged such that the first side is arranged to have an angle of 45° with respect to the first side surface plate.

As illustrated in FIG. 6B, in order to discharge the cooling air flowing from the air intake surface from air discharge surface, when compared with a case of $\alpha=90°$, the flow of the cooling air needs to be changed. In such a case, the width of each of the air intake surface and the air discharge surface is 400 mm. Accordingly, when compared with a case in which the printed circuit board is arranged at $\alpha=90°$, as illustrated in FIG. 6A, the volume of the cooling air flowing from the air intake surface is reduced and the cooling efficiency when the cooling air flows over the printed circuit board is also reduced.

However, with the arrangement of the printed circuit board illustrated in FIG. 6B, the connecting direction of each of the printed circuit board and the connecting circuit board has an angle of 45° with respect to the front surface plate. Accordingly, when compared with the arrangement of the printed circuit board illustrated in FIG. 6A, the printed circuit board may be easily removed from the casing by detaching the front surface plate of the casing that is on the same plane as that of the air intake surface and releasing the connection between the printed circuit board and the connecting circuit board.

Figure 6C:
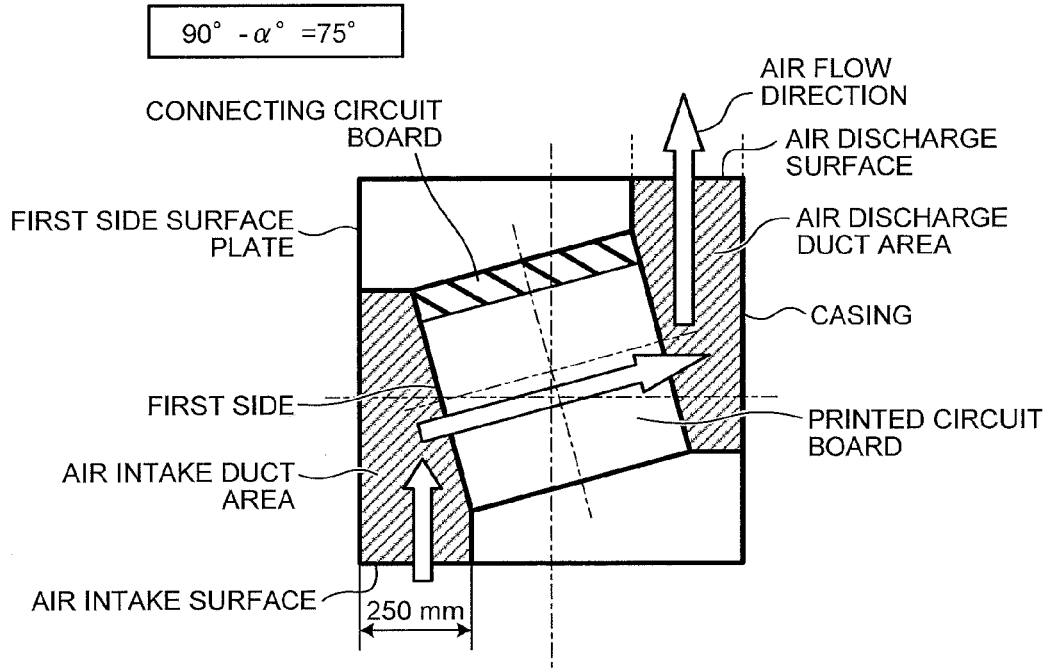
FIG. 6C is a schematic diagram illustrating an example of the arrangement of the printed circuit board in the casing for the electronic device.

Furthermore, as illustrated in FIG. 6C, a printed circuit board is arranged to have an angle of $\alpha=15°$, i.e., is arranged such that the air flow direction of the cooling air flowing from the air intake duct to the air discharge duct has an angle of $(90°-\alpha°)=75°$. In such a case, the printed circuit board is arranged such that the first side is arranged to have an angle of 15° with respect to the first side surface plate.

As illustrated in FIG. 6C, in order to discharge the cooling air flowing from the air intake surface to the air discharge surface, when compared with a case of $\alpha=45°$, the air flow needs to be further changed. Furthermore, the width of each of the air intake surface and the air discharge surface is 250 mm. Accordingly, when compared with an arrangement of the printed circuit board illustrated in FIG. 6B, the volume of the cooling air flowing from the air intake surface is further reduced and the cooling efficiency when the cooling air flows over the printed circuit board is further reduced.

However, with the arrangement of the printed circuit board illustrated in FIG. 6C, the connecting direction of each of the printed circuit board and the connecting circuit board has an angle of 15° with respect to the front surface plate. Accordingly, when compared with the arrangement of the printed circuit board illustrated in FIG. 6B, the printed circuit board may be more easily removed from the casing by detaching the front surface plate of the casing that is on the same plane as that of the air intake surface and releasing the connection between the printed circuit board and the connecting circuit board.

Figure 6D:
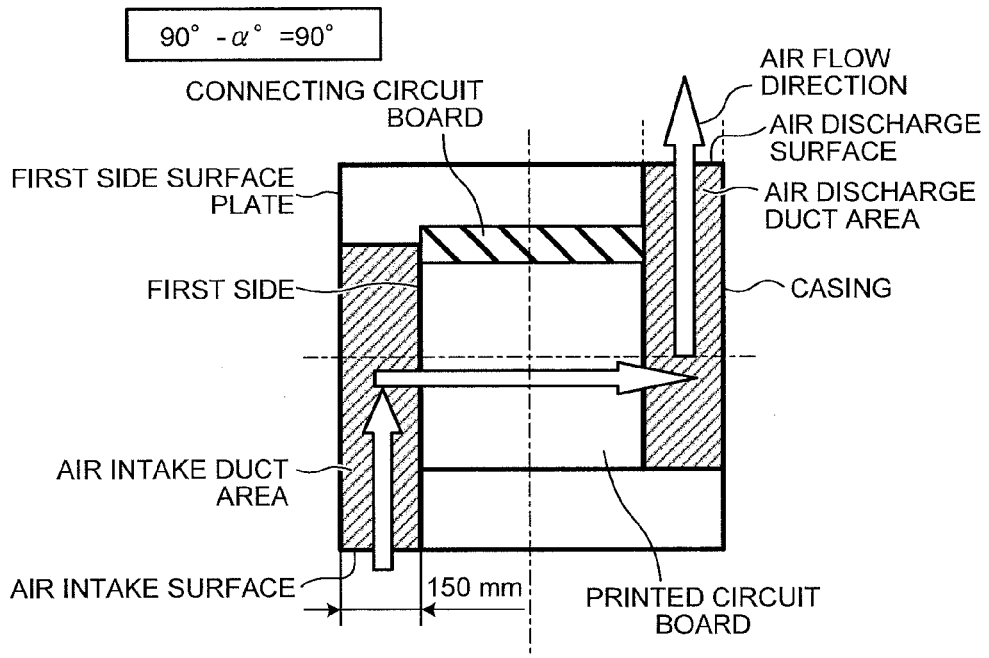
FIG. 6D is a schematic diagram illustrating an example of the arrangement of the printed circuit board in the casing for the electronic device.

Furthermore, as illustrated in FIG. 6D, the printed circuit board is arranged to have an angle of $\alpha=0°$, i.e., is arranged such that the air flow direction of the cooling air flowing from the air intake duct to the air discharge duct has an angle of $(90°-\alpha°)=90°$. In such a case, the printed circuit board is arranged such that the first side is arranged to have an angle of 90° with respect to the first side surface plate.

With the arrangement of the printed circuit board illustrated in FIG. 6D, the connecting direction of each of the printed circuit board and the connecting circuit board is arranged to have an angle of 0° with respect to the front surface plate. Accordingly, when compared with the arrangement of the printed circuit board illustrated in FIG. 6C, the printed circuit board may be more easily removed from the casing by detaching the front surface plate of the casing that is on the same plane as that of the air intake surface and releasing the connection between the printed circuit board and the connecting circuit board.

However, as illustrated in FIG. 6D, in order to discharge the cooling air flowing from the air intake surface to the air discharge surface, when compared with a case of α=15°, the air flow direction needs to be further changed. Furthermore, the width of each of the air intake surface and the air discharge surface is 150 mm. Accordingly, when compared with an arrangement of the printed circuit board illustrated in FIG. 6C, the volume of the cooling air flowing from the air intake surface is further reduced and the cooling efficiency when the cooling air flows over the printed circuit board is further reduced.

Figure 7:
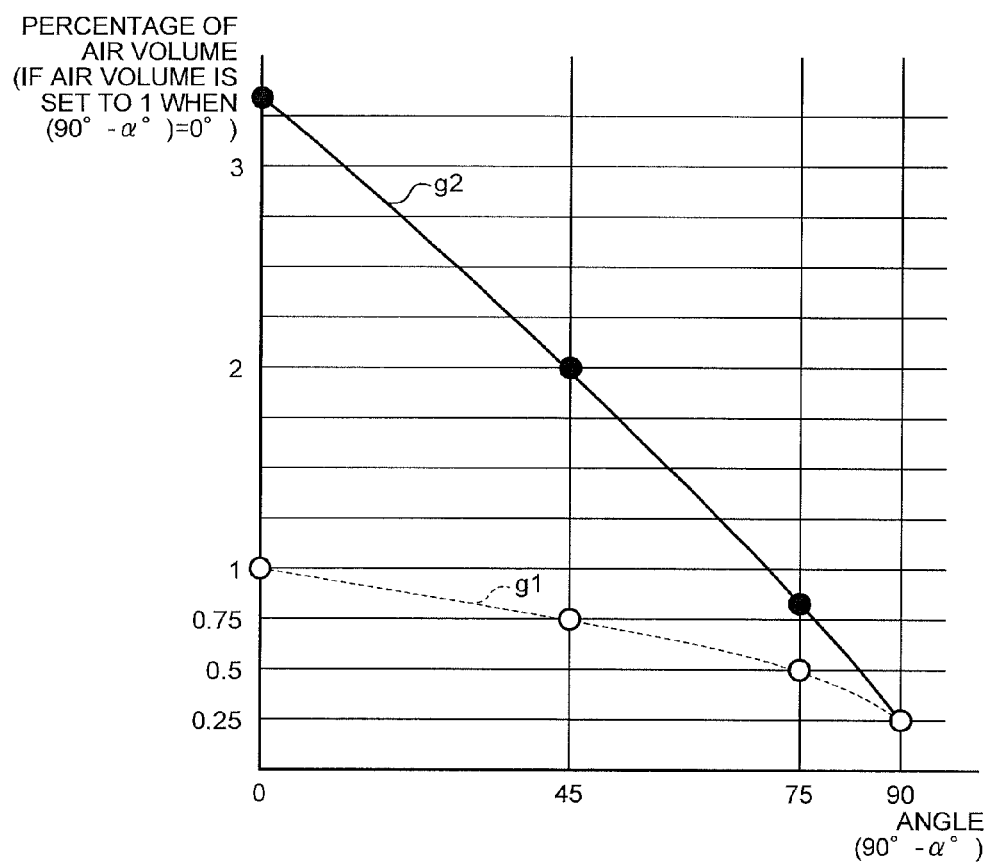
FIG. 7 is a graph illustrating the percentage changes in the air volume in accordance with changes in the arrangement of the printed circuit board in the casing for the electronic device according to an example of the second embodiment.

The relationship between the α° and the air volume described above is illustrated in FIG. 7. FIG. 7 is a graph illustrating the percentage changes in the air volume in accordance with changes in the arrangement of the printed circuit board in the casing for the electronic device according to an example of the second embodiment. The "percentage of the air volume" mentioned here means the percentage of the air volume that is obtained by changing α° with respect to the air volume flowing in and out when the air flow direction is (90°−α°)=0° in the casing 100a.

FIG. 7 illustrates graphs g1 and g2 in which the horizontal axis indicates (90°−α°) and the vertical axis indicates the percentage changes in the air volume. The graph g1 illustrates, when the air volume is set to "1" when (90°−α°)=0°, the percentage of the air volume obtained when changing the first angle α° at which the printed circuit board is arranged. The graph g2 illustrates, when the air volume is set to "1" when (90°−α°)=0°, the percentage of the air volume obtained by adding the air volume that is obtained in accordance with a change in the width of the air intake surface to the air volume obtained when changing the first angle α° at which the printed circuit board is arranged.

As illustrated in FIG. 7, the angle of the printed circuit board is changed to have an angle of α that is 90° (90°−α°=0°), 45° (90°−α°=45°), 15° (90°−α°=75°), and 0° (90°−α°=90°). At this time, the graph g1 takes a value of 1, 0.75, 0.5, and 0.25. Accordingly, the percentage of the air volume is simply reduced in accordance with (90°−α°).

The graph g2 takes a predetermined value equal to or greater than 3.25 but less than 3.5, a value of 2, and a predetermined value equal to or greater than 0.75 but less than 1. Accordingly, the air volume is simply reduced in accordance with (90°−α°). Specifically, the percentage of the air volume is simply reduced in accordance with the width of the air intake surface and in accordance with) (90°−α°).

However, as described above, the maintainability of the printed circuit board, when the connection between the printed circuit board and connecting circuit board is released to remove the printed circuit board from the casing, is improved in accordance with an increase in (90°−α°). Accordingly, the air volume and the maintainability of the printed circuit board have a trade-off relationship. Accordingly, (90°−α°), i.e., the angle of α, may be set to a value equal to or greater than 0° but less than 90° in accordance with the needed balance between the air volume and the maintainability of the printed circuit board.

(Cooling of the DIMM)

Figure 8:
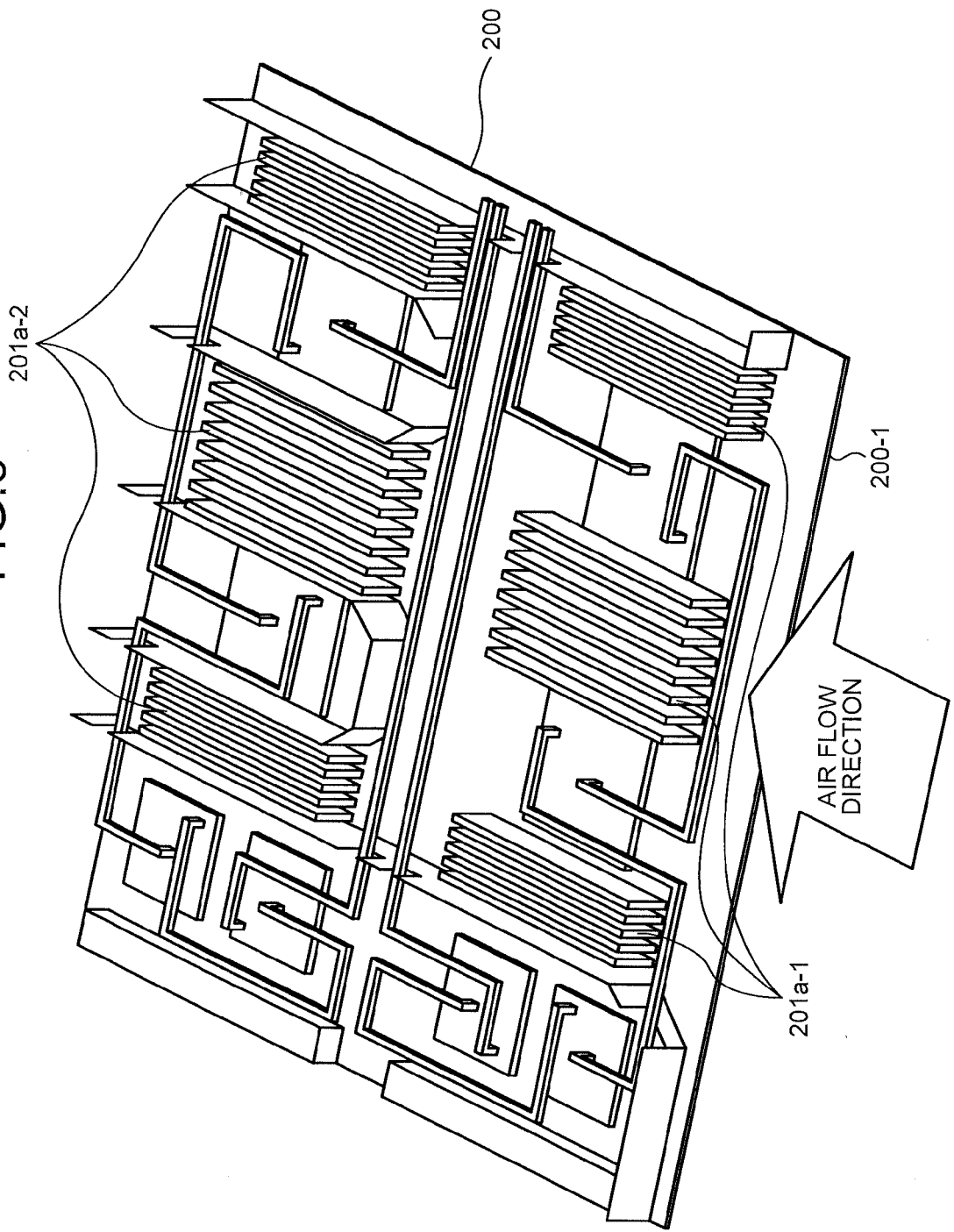
FIG. 8 is a schematic diagram illustrating the air flow direction with respect to the printed circuit board of the electronic device according to an example of the second embodiment.

FIG. 8 is a schematic diagram illustrating the air flow direction with respect to the printed circuit board of the electronic device according to an example of the second embodiment. As illustrated in FIG. 8, the cooling air is made to flow over the printed circuit board 200 such that the flow direction is perpendicular or substantially perpendicular to the arrangement direction of DIMMs 201a-1 and 201a-2 mounted on the printed circuit board 200.

In general, when cooling the DIMMs 201a-1 and 201a-2 mounted on the printed circuit board 200, in accordance with an increase in the air volume of the cooling air, the pressure loss of the cooling air increases due to the resistance of the DIMMs 201a-1 and 201a-2 with respect to the cooling air. The static pressure of the cooling device 113a decreases as the air volume of the cooling air increases. The static pressure is the pressure that acts on the vertical surface of the cooling device 113a with respect to the flow of the cooling air. Accordingly, the air volume of the cooling air needs to be set such that the static pressure of the cooling device 113a exceeds the pressure loss of the cooling air due to the DIMMs 201a-1 and 201a-2.

Figure 9:
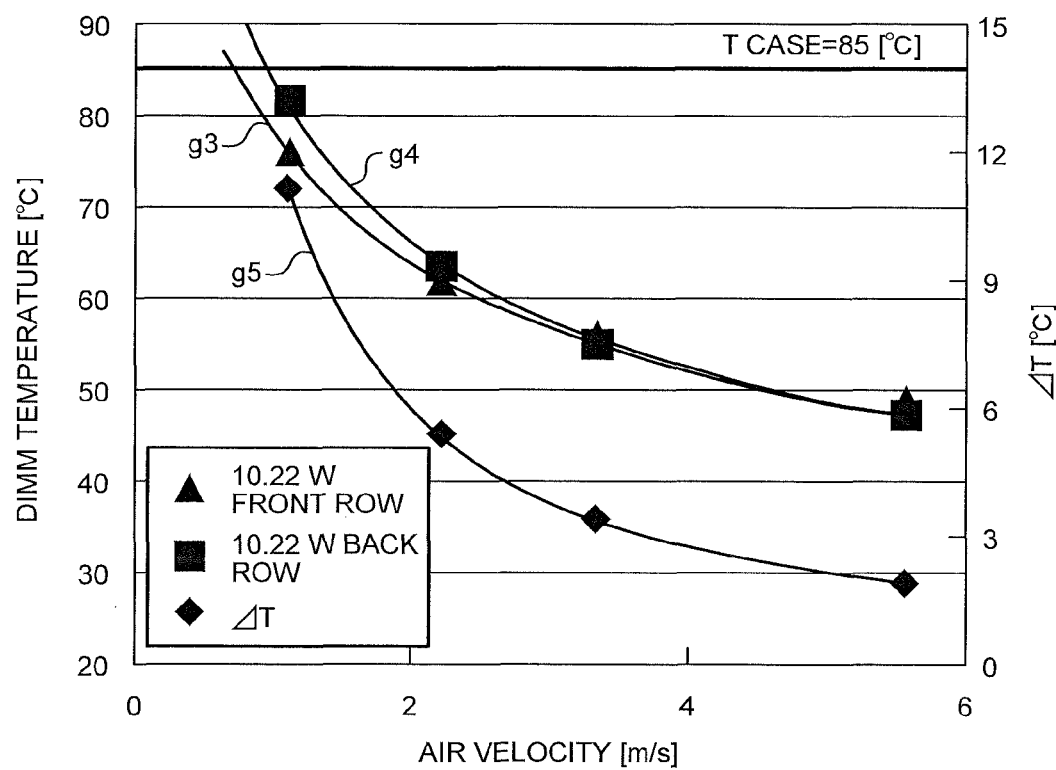
FIG. 9 is a schematic diagram illustrating the relationship between an air velocity and a temperature of a DIMM mounted on the printed circuit board of the electronic device according to an example of the second embodiment.

FIG. 9 is a schematic diagram illustrating the relationship between air velocity and the temperature of a DIMM mounted on the printed circuit board of the electronic device according to an example of the second embodiment. Specifically, in FIG. 9, a graph g3 and a graph g4 illustrate temperature changes of the DIMMs arranged on the front row and the back row in accordance with the air velocity of the cooling air, as illustrated in FIG. 8, when the cooling air is made to flow over the printed circuit board 200.

Here, the "front-row DIMM" is the DIMM 201a-1, whereas the "back-row DIMM" is the DIMM 201a-2. Furthermore, in FIG. 9, a graph g5 illustrates changes in temperature difference ΔT between the DIMM 201a-1 and the DIMM 201a-2 due to the air velocity of the cooling air. The "air velocity of the cooling air" mentioned here means the air velocity of the cooling air flowing over the printed circuit board 200 that passes through the first side 200-1 of the printed circuit board 200 in FIG. 8. Hereinafter, this air velocity is referred to as a "front air velocity".

In FIG. 9, the horizontal axis indicates the air velocity [m/s], the vertical axis on the left side indicates the DIMM temperature [° C.], and the vertical axis on the right side indicates the temperature difference ΔT [° C.]. In the example illustrated in FIG. 9, the electrical power consumption of each of the DIMMs 201a-1 and 201a-1 is 10.22 W. Furthermore, in the example illustrated in FIG. 9, the threshold of "T case", which indicates the upper limit of the temperature of the DIMM running at 10.22 W, is "85 [° C.]".

As indicated by the graph g3 illustrated in FIG. 9, the temperature of the DIMM 201a-1 is gradually decreased in accordance with the air velocity. Specifically, in the graph g3, as the air velocity increases, the temperature of the DIMM 201a-1 falls. This indicates that the DIMM 201a-1 is more efficiently cooled because the cooling air flows over the printed circuit board 200 faster.

Furthermore, as indicated by the graph g4 illustrated in FIG. 9, in a similar manner to the temperature of the DIMM 201a-1, the temperature of the DIMM 201a-2 is also gradually decreased in accordance with the air velocity. Specifically, as the air velocity increases, the temperature of the DIMM 201a-2 falls.

Furthermore, as indicated by the graph g5 illustrated in FIG. 9, similarly, ΔT obtained by subtracting the temperature of the DIMM 201a-1 from the temperature of the DIMM 201a-2 is also gradually decreased in accordance with the air velocity. Specifically, as the air velocity increases, the temperature difference between the DIMMs 201a-1 and 201a-2 is reduced.

Here, the temperature of the DIMM 201a-2 usually higher than that of the DIMM 201a-1. The reason for this is that, as will be described later, the air velocity of the cooling air that cools the DIMM 201a-2 is decreased when compared with the front air velocity thereof (see FIG. 10A) and that the temperature has already increased due to the cooling of the DIMM 201a-1 (see FIG. 10B).

Figure 10A:
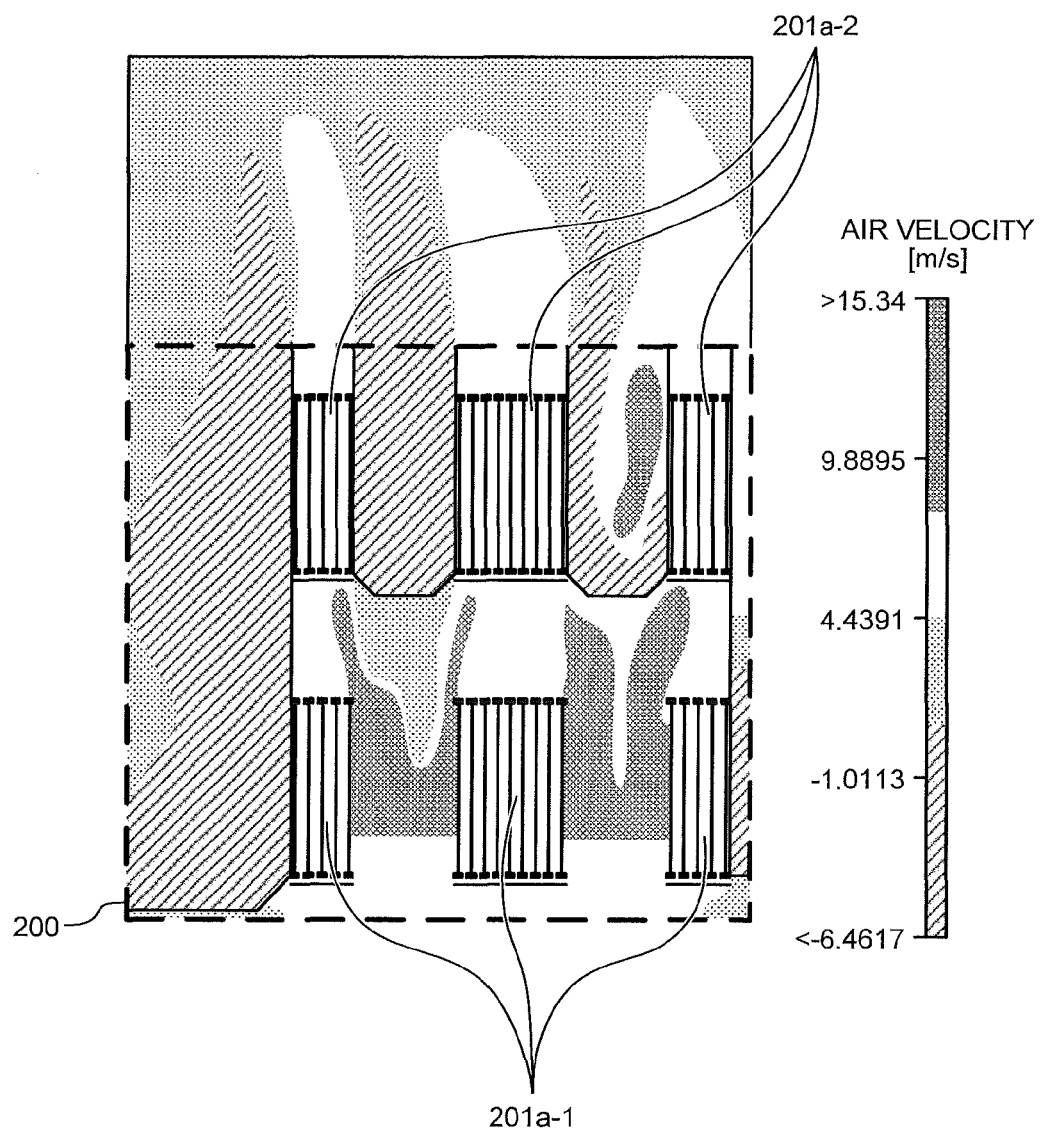
FIG. 10A is a schematic diagram illustrating the distribution of the air velocity flowing over the printed circuit board of the electronic device according to an example of the second embodiment.

FIG. 10A is a schematic diagram illustrating the distribution of the air velocity flowing over the printed circuit board of the electronic device according to an example of the second embodiment. FIG. 10A illustrates a case in which the front air velocity is "3 [m/s]". As illustrated in FIG. 10A, the air velocity of the cooling air that cools the DIMM 201a-2 is reduced when compared with the front air velocity and the air velocity of the cooling air that cools the DIMM 201a-1.

Figure 10B:
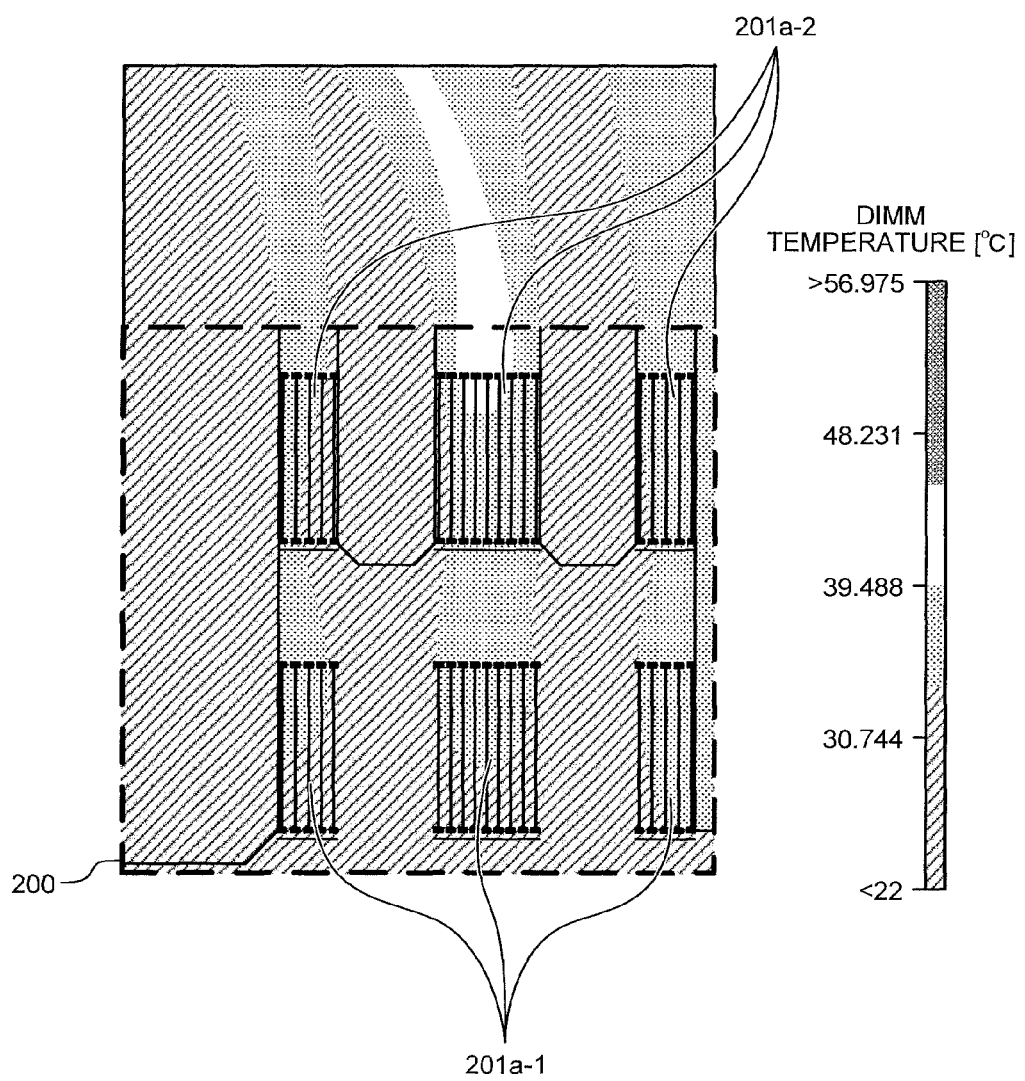
FIG. 10B is a schematic diagram illustrating the distribution of the temperature of the printed circuit board of the electronic device according to an example of the second embodiment.

FIG. 10B is a schematic diagram illustrating the distribution of the temperature of the printed circuit board of the electronic device according to an example of the second embodiment. FIG. 10B illustrates a case in which the front air velocity is "3 [m/s]". As illustrated in FIG. 10B, the temperature of the cooling air that cools the DIMM 201a-2 increases when compared with the temperature of the front air velocity and that of the cooling air that cools the DIMM 201a-1.

(Problems of the Conventional Technology)

Figure 11A:
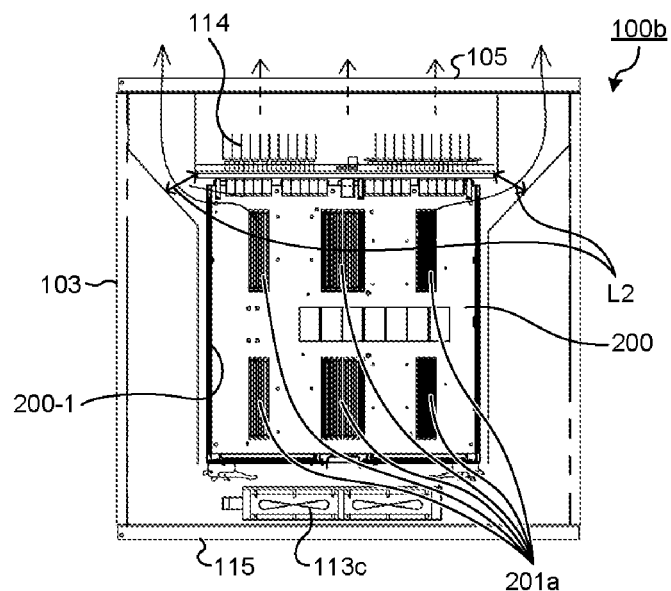
FIG. 11A is a schematic diagram illustrating an outline of the air inflow and outflow in a conventional electronic device (No. 1)

FIG. 11A is a schematic diagram illustrating an outline of the air inflow and outflow in a conventional electronic device (No. 1). With a casing 100b of an electronic device according to the conventional technology, the printed circuit board 200 is arranged at an angle of 0° with respect to the first side 200-1 in the horizontal direction. Furthermore, the DIMMs 201a having semiconductor memory elements that are mounted on both sides of a rectangular-plate shaped circuit board are arranged on the printed circuit board 200 such that a board of the DIMM 201a is parallel to the first side 200-1 of the printed circuit board 200.

A cooling device 113c is arranged between the front surface plate 115 and the printed circuit board 200 in the casing 100b. The cooling air flowing from the air intake port that is arranged on the front surface plate 115 in the casing 100a for the cooling device 113c cools the DIMM 201a and flows over the printed circuit board 200. Then, the cooling air flowing over the printed circuit board 200 is discharged out using the air discharge port arranged on the back surface plate 105 via a duct whose minimum width is "L2" and via a hole arranged on the connecting circuit board 114.

In the duct whose minimum width is "L2" and in the hole arranged on the connecting circuit board 114, the flow amount of the cooling air is limited. In other words, the duct and the connecting circuit board 114 are a bottleneck in terms of the flow of the cooling air over the printed circuit board 200. Accordingly, regarding the air flowing into and out of the electronic device according to the conventional technology illustrated in FIG. 11A, the efficiency of discharging the cooling air, flowing from the air intake port, by using the air discharge port arranged on the back surface plate 105 is low. Furthermore, the efficiency with which the DIMM 201a mounted on the printed circuit board 200 is cooled is low.

Figure 11B:
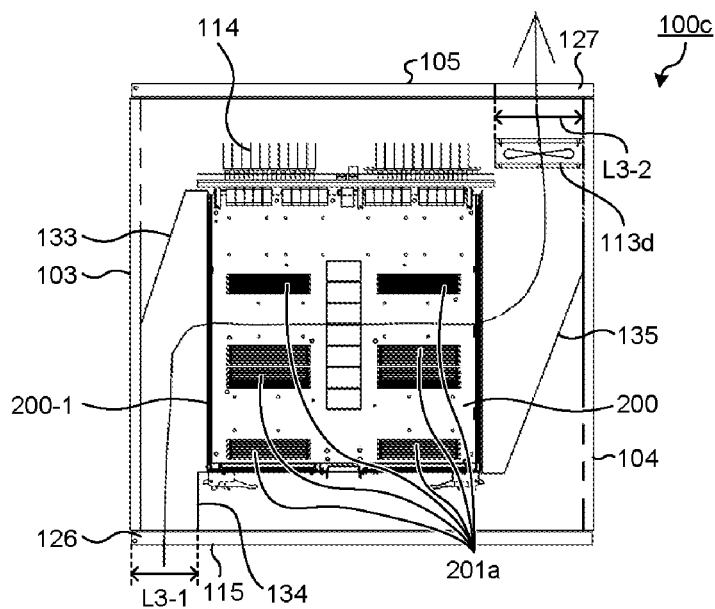
FIG. 11B is a schematic diagram illustrating an outline of the air inflow and outflow in a conventional electronic device (No. 2).

FIG. 11B is a schematic diagram illustrating an outline of the air inflow and outflow in a conventional electronic device (No. 2). As described above with reference to FIG. 11A, to avoid the bottleneck in the duct and the connecting circuit board 114 in terms of the flow of the cooling air over the printed circuit board 200, the printed circuit board 200 and the DIMM 201a are arranged as illustrated in FIG. 11B.

Specifically, in the casing 100c for the electronic device, the printed circuit board 200 is arranged at an angle of 0° with respect to the first side 200-1 in the horizontal direction. Furthermore, the DIMMs 201a having semiconductor memory elements that are mounted on both sides of a rectangular-plate shaped circuit board are arranged on the printed circuit board 200 such that the board of the DIMM 201a is perpendicular to the first side 200-1 of the printed circuit board 200.

Furthermore, in the casing 100c, an air intake duct area is arranged by a region bounded by duct walls 133 and 134 and the first side surface plate 103. Furthermore, in the casing 100c, an air discharge duct area is arranged by a region bounded by a duct wall 135, the second side surface plate 104, and a cooling device 113d. Furthermore, the cooling device 113d is arranged parallel to the back surface plate 105.

The air intake surface 126 having the width of "L3-1", which corresponds to the minimum distance between the first side surface plate 103 and the duct wall 134, is arranged on the front surface plate 115. The air discharge surface 127 having the width of "L3-2", which corresponds to the maximum width of the cooling device 113d that is arranged perpendicular to or substantially perpendicular to the flow of the cooling air, is arranged on the back surface plate 105.

As illustrated in FIG. 11B, when arranging the printed circuit board 200 in the casing 100c and making the air flow, as indicated by the arrow in FIG. 11B, the flow direction of the cooling air flowing in the casing 100c is substantially changed as it flows to the point at which it is discharged from the casing 100c.

The width "L3-1" of the air intake surface 126 is smaller than the width "L1-1" of the air intake surface 118 illustrated in FIG. 4. Similarly, the width "L3-2" of the air discharge surface 127 is smaller than the width "L1-2" of the air discharge surface 119 illustrated in FIG. 4. Specifically, the amount of cooling air drawn in from an air inlet surface is low and the efficiency of the cooling air flowing over the printed circuit board is low.

In recent years, with the conventional technology illustrated in FIG. 11B, the cooling capability has been insufficient because the amount of heat generated by the electronic components mounted on a printed circuit board has increased due to the increased performance of the electronic component. To address this problem, when adding a cooling device or reinforcing a duct area for the air flow, the size of the casing has become large.

(Advantage of the Second Embodiment)

With the electronic device according to an example of the second embodiment, the problem of the conventional technology described above may be addressed. Furthermore, the cooling capability may be enhanced, without increasing the size of the casing, by increasing the air intake surface, the air intake duct area, the air discharge surface, and the air discharge duct area and by adding a cooling device. Furthermore, it is possible to implement high-density assembly of the electronic device and to reduce the size of the casing. Specifically, with the electronic device according to an example of the second embodiment, it is possible to implement high-density mounting of components on the printed circuit board 200 in the electronic device.

Furthermore, because the cooling capability of the electronic device according to an example of the second embodiment improves, the processing performance of the printed circuit board 200 and the electronic device with high-density mounting printed circuit board 200 is improved. Furthermore, because the size of the casing for the electronic device may be reduced, the length of the cable used to connect multiple electronic devices is reduced, thus a high performance and large-scale server system may be easily constructed.

When cooling the electronic components mounted on the printed circuit board 200 by using the cooling devices 113a, which have the same cooling capability, when the first angle of α is, for example, 15°, the front air velocity is improved when compared with a case where α=0°; therefore, the electronic component is sufficiently cooled. The reason for this is because, when the first angle of α is 15°, the angle of the change in the flow direction of the cooling air flowing over the printed circuit board 200 is small when compared with a case when α=0°. Accordingly, because the air efficiently flows in and out, when the first angle α is 15°, the front air velocity is faster when compared in a case of α=0°.

Furthermore, when the first angle of α is, for example, 15°, the number of fans included in the cooling device 113a is reduced. Even when the rotational speed of the fan included in the cooling device 113a is reduced, there may be a case in which the electronic component is sufficiently cooled. Specifically, there may be a case in which the temperature of the electronic component may be kept less than the upper limit threshold. In other words, when the first angle of α is 15°, even when the cooling capability of the cooling device 113a is suppressed, there may be a case in which the electronic component may be sufficiently cooled. When the cooling capability of the cooling device 113a is suppressed within the range in which the temperature of the electronic component is less than the upper limit threshold, the consumption of the electrical power is reduced. Accordingly, the electronic device saves electrical power and a rise in temperature in the casing for the electronic device may be suppressed.

[Example of Another Embodiment]

With the electronic device, by using the first side surface plate 103 of each of the casings 100 and 100a according to examples of the first and second embodiments as a base plate and by using the second side surface plate 104 as the top plate, the printed circuit board 200 may also be vertically arranged. In such a case, the cooling air flowing in the casing 100 or 100a flows, in the casing 100 or 100a, in the direction from the base plate toward the top plate.

Furthermore, in the examples of the first and second embodiments, the cooling devices 113, 113a, and 113b are axial fans; however, they are not limited to axial fans. The cooling devices 113, 113a, and 113b may also be mixed flow fans or blowers. In other words, the cooling devices 113, 113a, and 113b may be any fan in the casing for the electronic device as long as the fan takes in and discharges the air by energizing the air in an appropriate direction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it is should be understood that the various changes, substitutions, and alterations could be made hereto without departing from the spirit and scope of the invention.

The invention claimed is:

1. An electronic device comprising:
  a casing that includes a front surface plate that has an air intake port, a back surface plate that has an air discharge port, the back surface plate opposes the front surface plate, a first side surface plate, a second side surface plate that opposes the first side surface plate, and a shelf that is horizontally arranged;
  a printed circuit board that has a first side and a second side and that is arranged, in a space bounded by the front surface plate, the back surface plate, the first side surface plate and the second side surface plate, and is arranged on and parallel to the shelf, such that the first side is arranged to have a first angle of α ($0°<α<90°$) with respect to the first side surface plate; and
  a cooling device that includes an air inlet surface having an air inlet port and an air outlet surface having an air outlet port, the cooling device is arranged in the casing between the printed circuit board and the air discharge port in the space, such that the air inlet surface is arranged to have a second angle of β ($0°<β<90°$) with respect to the first side surface plate, a length of the air discharge port in a horizontal direction being substantially equal to an overall width of the cooling device along a direction of the air outlet surface multiplied by sin β, wherein a portion of the cooling device between the air inlet surface and the air outlet surface is outside of a projected view of the length of the air discharge port in the horizontal direction.

2. The electronic device according to claim 1, wherein the second angle β and the first angle α have a relationship that satisfies $β≥α$.

3. The electronic device according to claim 1, wherein the printed circuit board further comprises a heat-generating component arranged such that air flowing into the cooling device flows, over the printed circuit board, between a front side and a rear side of the printed circuit board, and the cooling device cools the heat-generating component 4. The electronic device according to claim 1, further comprising:
  a first duct that is arranged between the second side of the printed circuit board and the cooling device; and
  a second duct that is arranged between the cooling device and the second side surface plate.

5. The electronic device according to claim 1, wherein the cooling device is a fan that includes a rotatable vane portion.

6. The electronic device according to claim 5, wherein the fan is an axial fan.

7. An electronic device comprising:
  a casing that includes a front surface plate that has an air intake port, a back surface plate that has an air discharge port and, the back surface plate opposes the front surface plate, a first side surface plate, a second side surface plate that opposes the first side surface plate, a shelf that is horizontally arranged, and a connecting circuit board that is arranged on the shelf;
  a plurality of printed circuit boards, each of the printed circuit boards has a first side and a second side and each of the printed circuit boards is arranged, in a space bounded by the front surface plate, the back surface plate, the first side surface plate and the second side surface plate, and each of the printed circuit boards is arranged on and parallel to the shelf, such that the first side is orthogonally connected to the connecting circuit board so as to have a first angle of α ($0°<α<90°$) with respect to the first side surface plate; and
  a cooling device that includes an air inlet surface having an air inlet port and an air outlet surface having an air outlet port, the cooling device is arranged in the casing, between the printed circuit boards and the air discharge port in the space, such that the air inlet surface is arranged to have a second angle of β ($0°<β<90°$) with respect to the first side surface plate, a length of the air discharge port in a horizontal direction being substantially equal to an overall width of the cooling device along a direction of the air outlet surface multiplied by sin β, wherein a portion of the cooling device between the air inlet surface and the air outlet surface is outside of a projected view of the length of the air discharge port in the horizontal direction.

8. The electronic device according to claim 7, wherein the second angle β and the first angle α have a relationship that satisfies β≥β.

9. The electronic device according to claim 7, wherein each of the printed circuit boards further comprises a heat-generating component is arranged such that air flowing into the cooling device flows, over the printed circuit boards, between a front side and a rear side of each of the printed circuit boards, and the cooling device cools the heat-generating component.

10. The electronic device according to claim 7, further comprising:
   a first duct that is arranged between the second side of each of the printed circuit boards and the cooling device; and
   a second duct that is arranged between the cooling device and the second side surface plate.

11. The electronic device according to claim 7, wherein the cooling device is a fan that includes a rotatable vane portion.

12. The electronic device according to claim 11, wherein the fan is an axial fan.

13. A casing for an electronic device, the casing comprising:
   a front surface plate that has an air intake port;
   a back surface plate that has an air discharge port and, the back surface plate opposes the front surface plate;
   a first side surface plate;
   a second side surface plate that opposes the first side surface plate;
   a shelf that has a first side and a second side that opposes the first side, the shelf is horizontally arranged, in a space bounded by the front surface plate, the back surface plate, the first side surface plate, and the second side surface plate, such that the first side has a first angle of α (0°<α<90°) with respect to the first side surface plate; and
   a cooling device that includes an air inlet surface having an air inlet port and an air outlet surface having an air outlet port, the cooling device is arranged in the casing, between the shelf and the air discharge port in the space, such that the air inlet surface is arranged to have a second angle of β (0°<β<90°) with respect to the first side surface plate, a length of the air discharge port in a horizontal direction being substantially equal to an overall width of the cooling device multiplied along a direction of the air outlet surface by sin β, wherein a portion of the cooling device between the air inlet surface and the air outlet surface is outside of a projected view of the length of the air discharge port in the horizontal direction.

14. The casing for the electronic device according to claim 13, wherein the second angle β and the first angle α have a relationship that satisfies β≥α.

15. The casing for the electronic device according to claim 13, further comprising:
   a first duct that is arranged between the second side of the shelf and the cooling device; and
   a second duct that is arranged between the cooling device and the second side surface plate.

16. The casing for the electronic device according to claim 13 wherein the cooling device is a fan that includes a rotatable vane portion.

17. The casing for the electronic device according to claim 16, wherein the fan is an axial fan.

* * * * *

UNITED STATES PATENT AND TRADEMARK OFFICE
CERTIFICATE OF CORRECTION

Page 1 of 2

PATENT NO. : 8,953,312 B2
APPLICATION NO. : 13/445386
DATED : February 10, 2015
INVENTOR(S) : Akira Shimasaki et al.

It is certified that error appears in the above-identified patent and that said Letters Patent is hereby corrected as shown below:

Claims

Claim 1, Column 19, Line 67
Delete "plate" and insert --plate,--, therefor.

Claim 1, Column 20, Line 6
Delete "casing" and insert --casing,--, therefor.

Claim 2, Column 20, Line 20
Delete "βand" and insert --β and--, therefor.

Claim 3, Column 20, Line 27
Delete "component" and insert --component.--, therefor.

Claim 7, Column 20, Line 42
Delete "port and," and insert --port,--, therefor.

Claim 7, Column 20, Line 51
Delete "plate" and insert --plate,--, therefor.

Claim 8, Column 21, Line 5
Delete "βand" and insert --β and--, therefor.

Signed and Sealed this
Thirteenth Day of October, 2015

Michelle K. Lee
*Director of the United States Patent and Trademark Office*

CERTIFICATE OF CORRECTION (continued)
U.S. Pat. No. 8,953,312 B2

Claim 8, Column 21, Line 6

Delete "$\beta \geq \beta.$" and insert --$\beta \geq \alpha.$--, therefor.

Claim 14, Column 22, Line 21

Delete "a" and insert --$\alpha$--, therefor.